(12) United States Patent
Tanaka

(10) Patent No.: US 8,404,559 B2
(45) Date of Patent: Mar. 26, 2013

(54) SEMICONDUCTOR DEVICE PRODUCTION METHOD AND SEMICONDUCTOR DEVICE

(75) Inventor: Bungo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 376 days.

(21) Appl. No.: 12/588,611

(22) Filed: Oct. 21, 2009

(65) Prior Publication Data

US 2010/0096721 A1    Apr. 22, 2010

(30) Foreign Application Priority Data

Oct. 22, 2008    (JP) .................................. 2008-272142

(51) Int. Cl.
*H01L 21/76*    (2006.01)
(52) U.S. Cl. ......................... 438/425; 428/404; 428/430
(58) Field of Classification Search .................. 438/404, 438/424, 425, 430, 439
See application file for complete search history.

(56) References Cited

U.S. PATENT DOCUMENTS

| | | | |
|---|---|---|---|
| 5,872,044 A * | 2/1999 | Hemmenway et al. | ....... 438/426 |
| 6,642,599 B1 | 11/2003 | Watabe et al. | |
| 7,825,430 B2 * | 11/2010 | Terashima | ................... 257/140 |

FOREIGN PATENT DOCUMENTS

JP    2006-186392 A    7/2006

* cited by examiner

*Primary Examiner* — Jack Chen
(74) *Attorney, Agent, or Firm* — Rabin & Berdo, P.C.

(57) ABSTRACT

A semiconductor device production method according to the present invention includes the steps of: forming a LOCOS oxide film in a surface of a silicon layer by a LOCOS method; forming an impurity region in the silicon layer by introducing an impurity into the silicon layer; and sequentially removing parts of the LOCOS oxide film and the silicon layer to form a trench for isolation of the impurity region after the formation of the LOCOS oxide film and the impurity region.

6 Claims, 21 Drawing Sheets

1

SEMICONDUCTOR DEVICE PRODUCTION METHOD AND SEMICONDUCTOR DEVICE

BACKGROUND OF THE INVENTION

1. Field of the Invention

The present invention relates to a semiconductor device production method and a semiconductor device.

2. Description of Related Art

A DTI (deep trench isolation) technique is known as a device isolation technique for electrically isolating a high breakdown voltage element such as a high breakdown voltage MOSFET (metal oxide semiconductor field effect transistor) from other element.

FIG. 9 is a schematic sectional view showing the construction of a semiconductor device employing the DTI technique.

The semiconductor device 101 includes a thick SOI (silicon-on-insulator) substrate 102. The thick SOI substrate 102 is configured such that an N-type epitaxial layer 105 of Si (silicon) is provided on a silicon substrate 103 via a BOX (buried oxide) layer 104 of $SiO_2$ (silicon oxide).

An annular deep trench 106 is provided in the epitaxial layer 105 as extending thicknesswise through the epitaxial layer 105. Oxide films 107 of $SiO_2$ are provided on side surfaces of the deep trench 106. The deep trench 106 is filled with polysilicon 108 with the intervention of the oxide films 107. A region surrounded by the deep trench 106 serves as an element formation region 109 which is isolated from its peripheral region.

A LOCOS oxide film 110 is selectively provided in a surface portion of the epitaxial layer 105 in the element formation region 109. A high breakdown voltage element (e.g., MOSFET) 111 and a floating capacitor 112 are provided in the element formation region 109. Further, the thick SOI substrate 102 is covered with an interlayer dielectric film 113 of $SiO_2$.

For production of the semiconductor device 101, the deep trench 106 is first formed in the epitaxial layer 105, and then filled with the polysilicon 108 with the intervention of the oxide films 107. Thus, the element formation region 109 is isolated from its peripheral region. Thereafter, the LOCOS oxide film 110 is formed in the surface portion of the epitaxial layer 105 in the element formation region 109 by a LOCOS (local-oxidation-of-silicon) method. Then, an impurity is selectively implanted into the surface portion of the epitaxial layer 105 in the element formation region 109 by an ion implantation method, whereby impurity regions including a source region and a drain region of the P-channel MOSFET 111 are formed.

In the formation of the LOCOS oxide film 110, a heat treatment is performed. Further, a heat treatment is performed for activation of the impurity implanted into the epitaxial layer 105 in the formation of the impurity regions. When the heat treatments are performed, stress occurring due to a difference in material between the epitaxial layer 105 and the oxide films 107 is concentrated on portions of the epitaxial layer 105 adjacent to upper and lower edges of the trench 106. Therefore, the repetitive heat treatments may result in crystal defects 114 occurring in the portions of the epitaxial layer 105 adjacent to the upper and lower edges of the trench 106 due to the concentration of the stress.

SUMMARY OF THE INVENTION

It is an object of the present invention to provide a semiconductor device production method and a semiconductor device, which prevent crystal defects which may otherwise occur in portions of a silicon layer adjacent to a trench due to heat treatments.

A semiconductor device according to one aspect of the present invention includes: a silicon layer; a LOCOS oxide film selectively provided in a surface of the silicon layer, an impurity region provided in the silicon layer and containing an impurity introduced therein; and a trench continuously extending through the LOCOS oxide film and the silicon layer for isolation of the impurity region.

A production method for the semiconductor device includes the steps of: forming a LOCOS oxide film in a surface of a silicon layer by a LOCOS method; forming an impurity region in the silicon layer by introducing an impurity into the silicon layer; and sequentially removing parts of the LOCOS oxide film and the silicon layer to form a trench for isolation of the impurity region after the formation of the LOCOS oxide film and the impurity region.

In this production method, the LOCOS oxide film is formed in the surface of the silicon layer, and the impurity region is formed in the silicon layer. Then, the parts of the LOCOS oxide film and the silicon layer are sequentially removed to form the trench. That is, the formation of the LOCOS oxide film and the impurity region precedes the formation of the trench. Since heat treatments for the formation of the LOCOS oxide film and the impurity region are completed before the formation of the trench, there is no possibility that stress (thermal stress) attributable to the heat treatments occurs in portions of the silicon layer adjacent to the trench. This prevents crystal defects which may otherwise occur in the portions of the silicon layer adjacent to the trench due to the thermal stress.

The production method may further include the step of forming a trench oxide film on a side surface of the trench.

In this case, the formation of the trench oxide film may be achieved by employing a thermal oxidation method or a TEOS-CVD method, or by employing the thermal oxidation method and the TEOS-CVD method in combination. In the TEOS-CVD method, $SiO_2$ can be formed at a lower temperature than in the thermal oxidation method. Therefore, where the trench oxide film is formed as having a relatively great thickness, the TEOS-CVD method is preferably employed either alone or in combination with the thermal oxidation method for the formation of the trench oxide film. This prevents the crystal defects which may otherwise occur in the portions of the silicon layer adjacent to the trench due to the thermal stress in the formation of the trench oxide film.

The production method may further include the steps of: forming an SiN layer of SiN and an $SiO_2$ layer of $SiO_2$ in this order on the silicon layer prior to the formation of the trench after the formation of the LOCOS oxide film and the impurity region; and forming an opening in the SiN layer and the $SiO_2$ layer for selectively exposing a surface of the LOCOS oxide film by a photolithography and etching process, wherein the trench is formed by etching the LOCOS oxide film and the silicon layer by using the SiN layer and the $SiO_2$ layer as a mask after the formation of the opening.

The production method may further include the steps of: depositing polysilicon in the trench by using the mask to fill the trench with the polysilicon; and etching back the $SiO_2$ layer to remove the $SiO_2$ layer after the trench is filled with the polysilicon.

Where the $SiO_2$ layer is removed by the etch-back, the $SiO_2$ layer is liable to partly remain on the SiN layer.

Therefore, the production method may further include the steps of: removing the SiN layer after the removal of the $SiO_2$ layer; and forming an interlayer dielectric film of $SiO_2$ on the silicon layer after the removal of the SiN layer. By removing the SiN layer after the removal of the SiO₂ layer, a part of the SiO₂ layer remaining on the SiN layer can be removed together with the SiN layer. Thereafter, the interlayer dielectric film is formed on the silicon layer, whereby the silicon layer can be properly covered with the interlayer dielectric film of the SiO₂ single layer structure.

After the removal of the SiO₂ layer, the interlayer dielectric film of SiO₂ may be formed on the SiN layer without the removal of the SiN layer. Even if the SiO₂ layer partly remains on the SiN layer, the remaining part of the SiO₂ layer is unified with the interlayer dielectric film thereafter formed. The SiN layer also has an electrically insulative property. Therefore, even if the SiN layer is present between the silicon layer and the interlayer dielectric film, there is no problem associated with insulation between the silicon layer and interconnections provided on the interlayer dielectric film. On the other hand, the step of removing the SiN layer is obviated, thereby simplifying the semiconductor device production process.

Alternatively, the steps of forming an SiO₂ layer of SiO₂ on the silicon layer prior to the formation of the trench after the formation of the LOCOS oxide film and the impurity region and forming an opening in the SiO₂ layer for selectively exposing a surface of the LOCOS oxide film by a photolithography and etching process may be performed. The trench may be formed by etching the LOCOS oxide film and the silicon layer by using the SiO₂ layer as a mask after the formation of the opening.

In this case, the steps of depositing polysilicon in the trench by using the mask to fill the trench with the polysilicon and planarizing a surface of the SiO₂ layer after the trench is filled with the polysilicon may be performed.

Alternatively, the steps of depositing polysilicon in the trench by using the mask to fill the trench with the polysilicon etching back the SiO₂ layer to remove the SiO₂ layer after the trench is filled with the polysilicon and forming an interlayer dielectric film of SiO₂ on the silicon layer after the removal of the SiO₂ layer may be performed.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
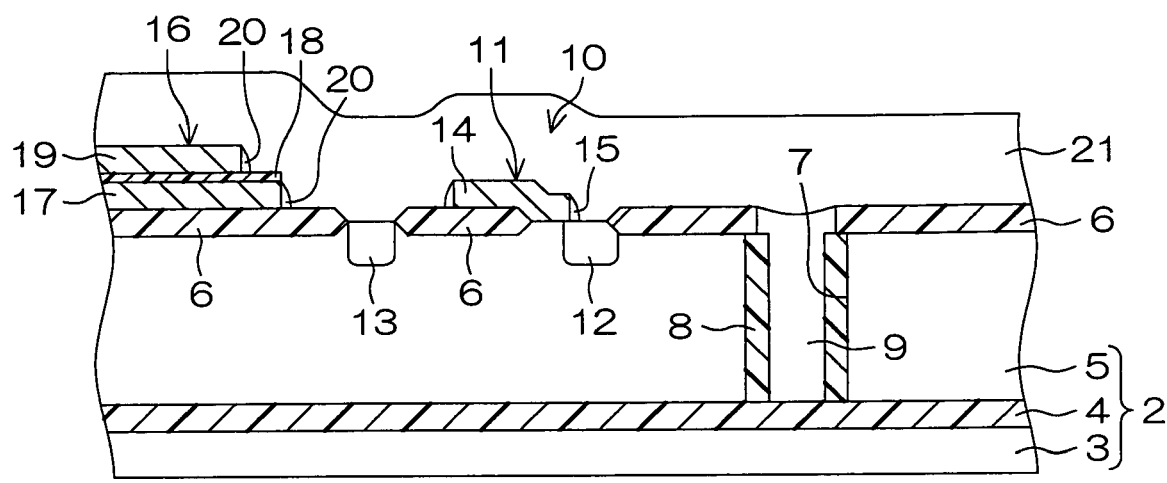
FIG. 1 is a schematic sectional view of a semiconductor device according to a first embodiment of the present invention.

FIG. 1 is a schematic sectional view of a semiconductor device according to a first embodiment of the present invention.

The semiconductor device 1 includes a thick SOI substrate 2. The thick SOI substrate 2 is configured such that an N-type silicon layer 5 of Si is provided on a silicon substrate 3 via a BOX layer 4 of SiO₂. A LOCOS oxide film 6 is selectively provided in a surface of the silicon layer 5.

An annular trench 7 is provided in the thick SOI substrate 2. The trench 7 is formed as extending through the silicon layer 5 by removing a part of the LOCOS oxide film 6 and then a part of the silicon layer 5. Trench oxide films 8 of SiO₂ are provided on side surfaces of the trench 7. The trench 7 is filled with polysilicon 9 with the intervention of the trench oxide films 8. Thus, a region surrounded by the trench 7 serves as an element formation region 10 which is isolated (dielectrically isolated) from its peripheral region by the trench oxide films 8.

A P-channel MOSFET 11, for example, is provided in the element formation region 10. More specifically, a P-type source region 12 and a P-type drain region 13 are provided in spaced relation in a surface portion of the silicon layer 5 in the element formation region 10. A part of the LOCOS oxide film 6 is present between the source region 12 and the drain region 13 in the surface of the silicon layer 5 in spaced relation from the source region 12. A gate electrode 14 of a metal material is provided between the part of the LOCOS oxide film 6 and the source region 12 on the surface of the silicon layer 5 via a gate oxide film (not shown). The gate electrode 14 partly overlies the part of the LOCOS oxide film 6 to serve as a field plate. Side surfaces of the gate electrode 14 are covered with a sidewall 15.

A floating capacitor 16 is provided in the element formation region 10. More specifically, a lower electrode 17 of a metal material is provided on another part of the LOCOS oxide film 6 present on a lateral side of the P-channel MOSFET 11 in the element formation region 10. An insulation film 18 and an upper electrode 19 of a metal material are provided in this order on the lower electrode 17. Side surfaces of the lower electrode 17 and the upper electrode 19 are covered with sidewalls 20.

An interlayer dielectric film 21 of SiO₂ is provided on the surface of the silicon layer 5.

FIGS. 2A to 2L are schematic sectional views showing a process sequence for producing the semiconductor device shown in FIG. 1.

Figure 2A:
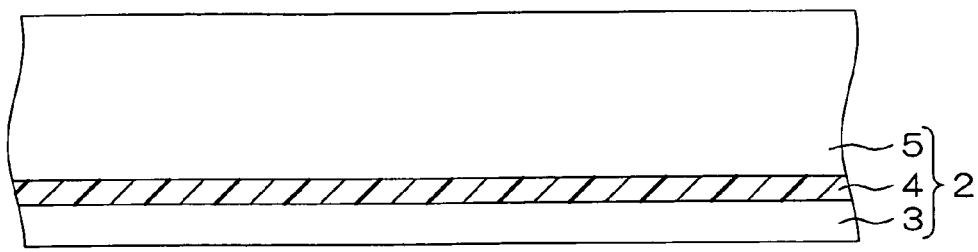
FIGS. 2A to 2L are schematic sectional views showing a process sequence for producing the semiconductor device shown in FIG. 1.

As shown in FIG. 2A, a silicon substrate 3 formed with a BOX layer 4 is prepared, and a silicon layer 5 is formed on the BOX layer 4 by an epitaxial growth method.

Figure 2B:
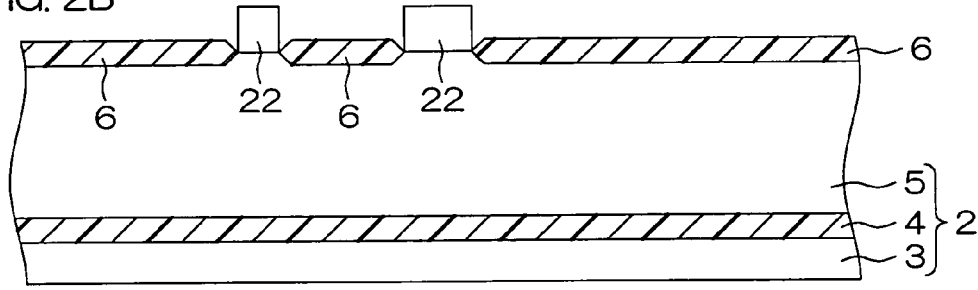

Next, as shown in FIG. 2B, a LOCOS oxide film 6 is formed on the silicon layer 5 by a LOCOS method. More specifically, a mask 22 is formed on the silicon layer 5 as having an opening for selectively exposing a portion of the silicon layer 5 on which the LOCOS oxide film 6 is to be formed. Then, the LOCOS oxide film 6 is formed by thermally oxidizing the portion of the silicon layer 5 exposed from the opening of the mask 22. The mask 22 is removed after the formation of the LOCOS oxide film 6.

Figure 2C:
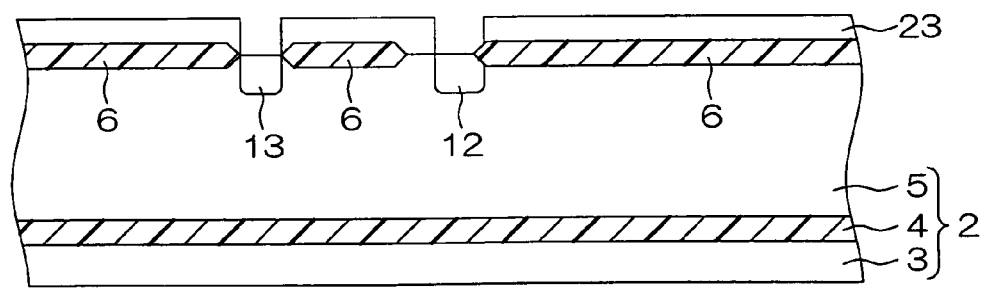

In turn, as shown in FIG. 2C, a mask 23 is formed on the silicon layer 5 as having openings for selectively exposing portions of the silicon layer 5 in which a source region 12 and a drain region 13 are to be formed. Then, a P-type impurity is implanted into surface portions of the silicon layer 5 via the mask 23 by an ion implantation method. The impurity implanted into the surface portions of the silicon layer 5 is activated by a heat treatment, whereby the source region 12 and the drain region 13 are formed. The mask 23 is removed after the formation of the source region 12 and the drain region 13.

Figure 2D:
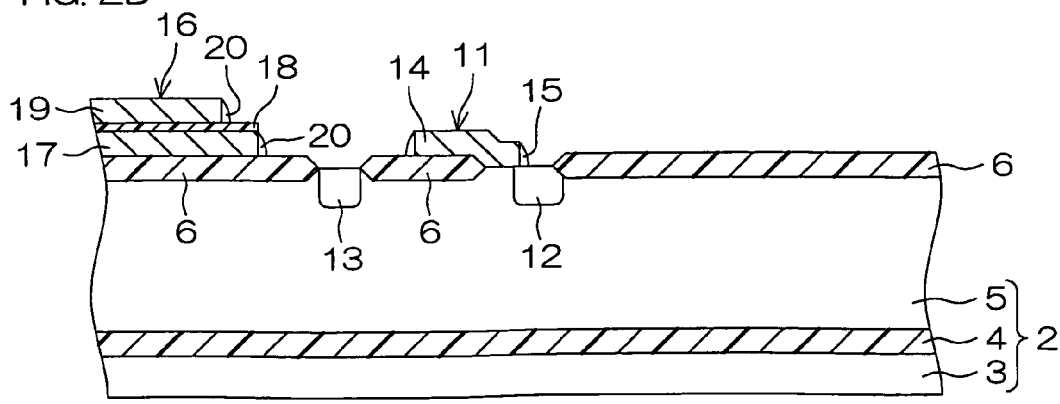

Thereafter, as shown in FIG. 2D, a gate electrode 14 of a P-channel MOSFET 11 and a floating capacitor 16 are formed on the silicon layer 5 and the LOCOS oxide film 6 in a region which later serves as an element formation region 10 (see FIG. 1).

Figure 2E:
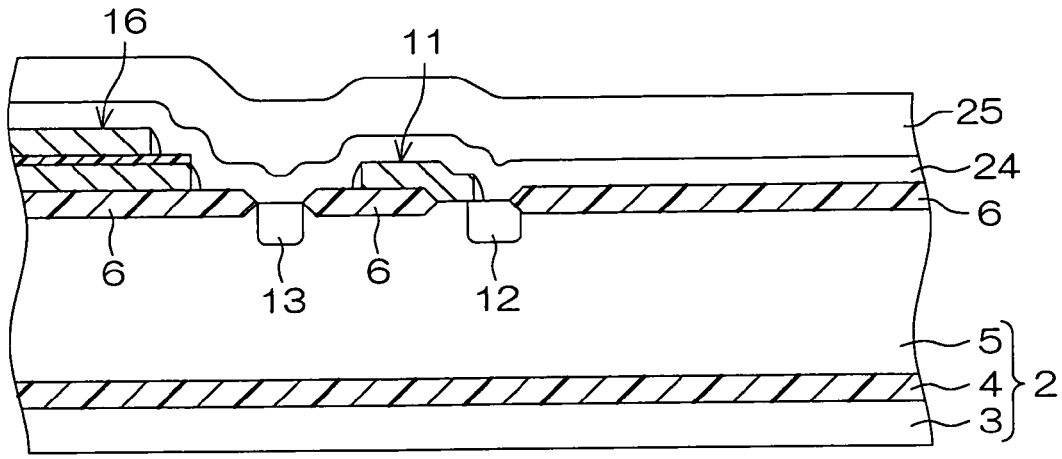

Subsequently, as shown in FIG. 2E, an SiN layer 24 of SiN (silicon nitride) and an $SiO_2$ layer 25 of $SiO_2$ are formed on the silicon layer 5 in this order from the side of the silicon layer 5 by a LPCVD (low pressure chemical vapor deposition) method.

Figure 2F:
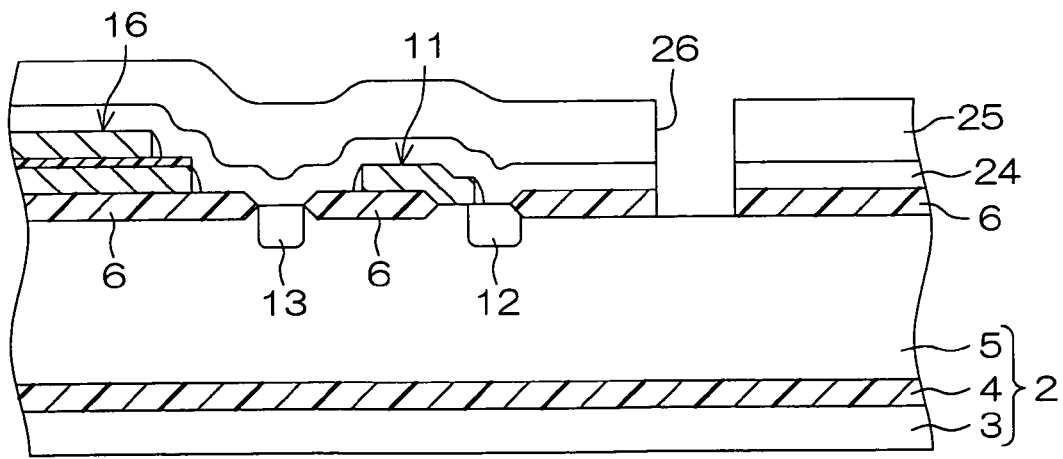

Then, as shown in FIG. 2F, the $SiO_2$ layer 25, the SiN layer 24 and the LOCOS oxide film 6 are selectively removed by a photolithography and etching process, whereby an opening 26 is formed in the $SiO_2$ layer 25, the SiN layer 24 and the LOCOS oxide film 6 as extending through the $SiO_2$ layer 25, the SiN layer 24 and the LOCOS oxide film 6 to expose a part of a surface of the silicon layer 5.

Figure 2G:
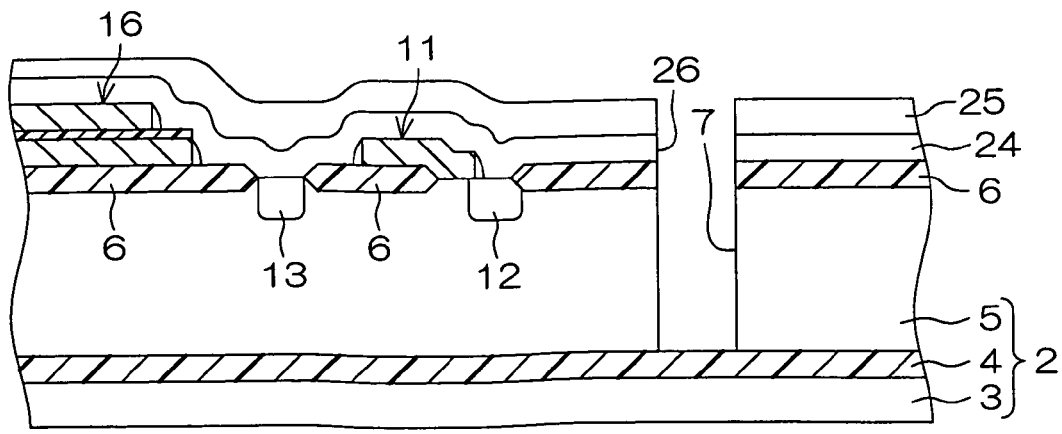

Thereafter, as shown in FIG. 2G, the silicon layer 5 is etched via the opening 26 formed in the $SiO_2$ layer 25, the SiN layer 24 and the LOCOS oxide film 6. Thus, a trench 7 is formed in the silicon layer 5 as communicating with the opening 26. The etching of the silicon layer 5 is terminated when the BOX layer 4 is exposed.

Figure 2H:
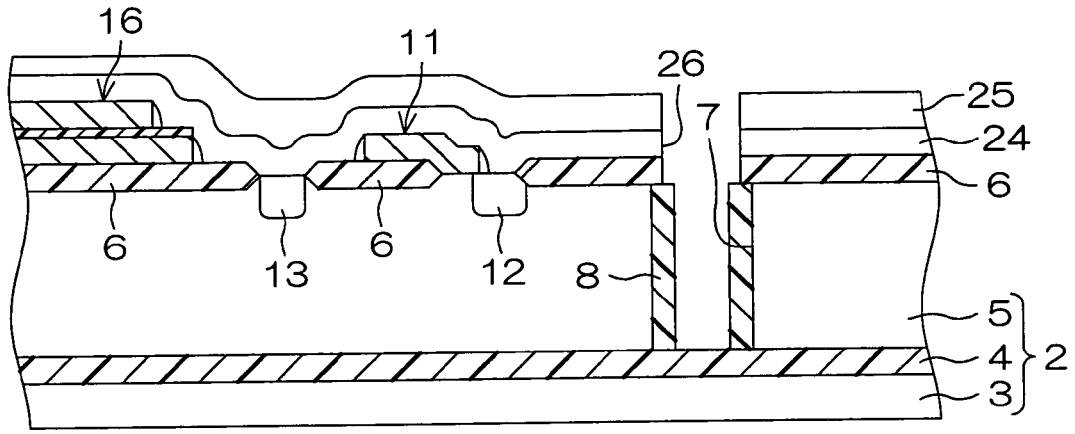

In turn, as shown in FIG. 2H, trench oxide films 8 are formed on side surfaces of the trench 7 by a thermal oxidation method.

Figure 2I:
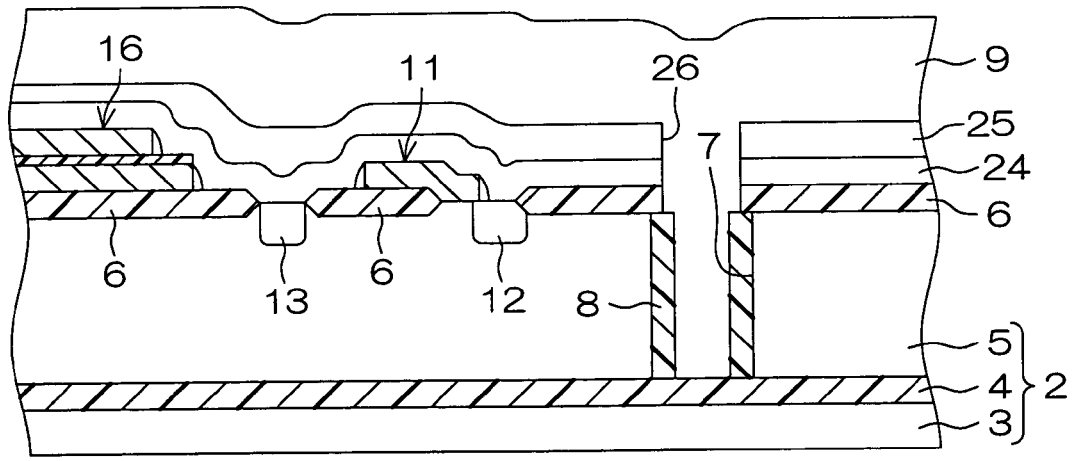

Thereafter, as shown in FIG. 2I, polysilicon 9 is deposited over the $SiO_2$ layer 25 including the trench 7 to a thickness such as to fill the trench 7 and cover the entire surface of the $SiO_2$ layer 25 by a CVD method.

Figure 2J:
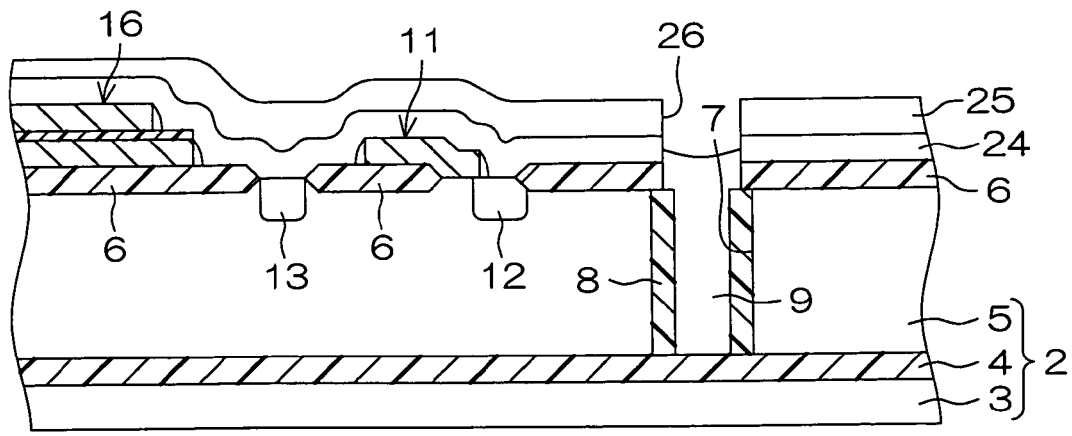

Then, the polysilicon 9 is etched back (by an entire surface dry-etching method). Through this etch-back, a part of the polysilicon 9 remains in the trench 7 as shown in FIG. 2J.

Figure 2K:
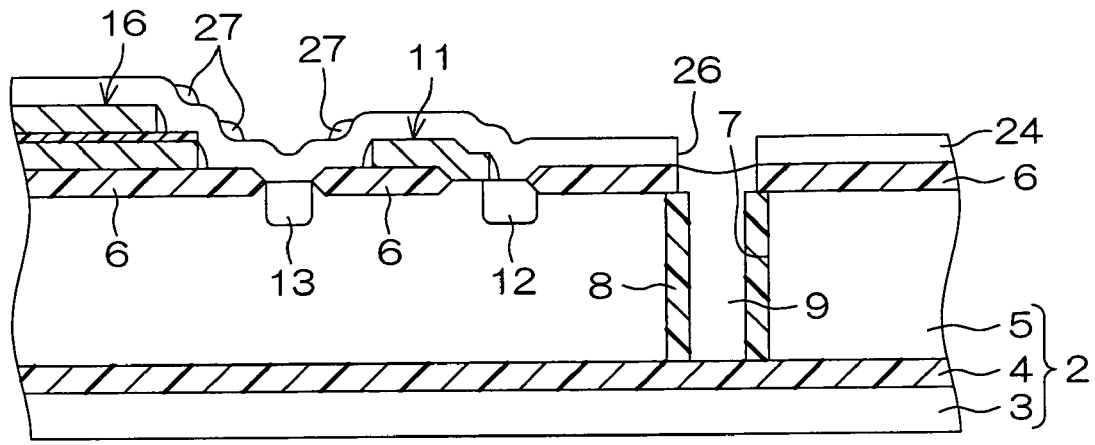

Thereafter, the $SiO_2$ layer 25 is etched back for removal thereof. Thus, as shown in FIG. 2K, a surface of the SiN layer 24 is exposed. At this time, a very small amount of a residue 27 of the $SiO_2$ layer 25 remains in steps of the SiN layer 24.

Figure 2L:
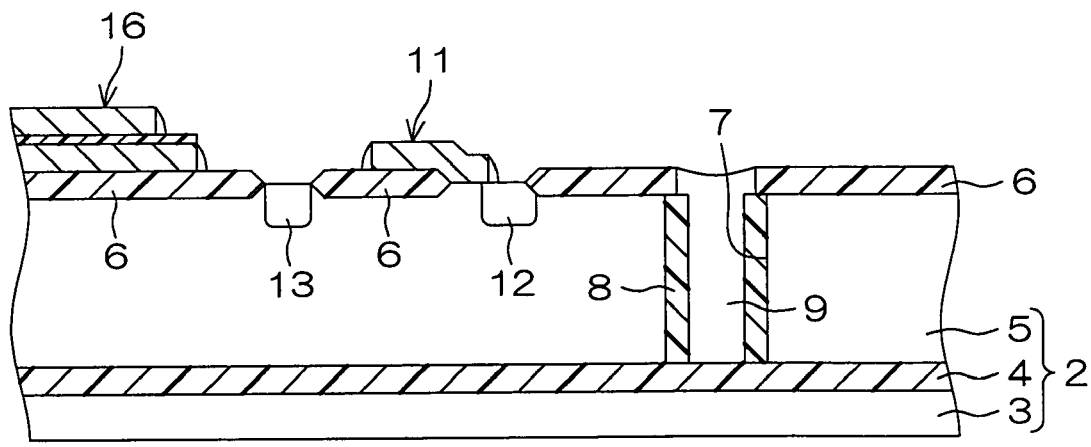

Subsequently, as shown in FIG. 2L, the SiN layer 24 is removed together with the residue 27 present in the steps thereof by a wet etching method. Then, an interlayer dielectric film 21 of $SiO_2$ is formed on the silicon layer 5 by a CVD method. Thus, the semiconductor device 1 shown in FIG. 1 is produced.

As described above, the heat treatments for the formation of the LOCOS oxide film 6, the source region 12 and the drain region 13 are completed prior to the formation of the trench 7, thereby eliminating the possibility that stress (thermal stress) attributable to the heat treatments occurs in portions of the silicon layer 5 adjacent to the trench 7. This prevents crystal defects which may otherwise occur in the portions of the silicon layer 5 adjacent to the trench 7 due to the thermal stress.

The formation of the trench oxide films 8 may be achieved by employing a TEOS-CVD method or by employing the thermal oxidation method and the TEOS-CVD method in combination rather than by employing the thermal oxidation method alone. In the TEOS-CVD method, the formation of the $SiO_2$ layer can be achieved at a lower temperature than in the thermal oxidation method. Therefore, where the trench oxide films 8 are each formed as having a relatively great thickness, the TEOS-CVD method is preferably employed either alone or in combination with the thermal oxidation method for the formation of the trench oxide films 8. For example, the formation of the trench oxide films 8 may be achieved by first forming oxide films each having a relatively small thickness (e.g., 65 nm) by the thermal oxidation method, and then forming TEOS films each having a relatively great thickness (e.g., 660 nm) on these oxide films by the TEOS-CVD method. This prevents the crystal defects which may otherwise occur in the portions of the silicon layer 5 adjacent to the trench 7 due to the thermal stress in the formation of the trench oxide films 8.

Further, when the $SiO_2$ layer 25 is etched back for the removal thereof, the residue 27 of the $SiO_2$ layer 25 is liable to remain on the SiN layer 24. The residue 27 of the $SiO_2$ layer 25 remaining on the SiN layer 24 can be removed together with the SiN layer 24 by removing the SiN layer 24 after the removal of the $SiO_2$ layer 25. Thereafter, the interlayer dielectric film 21 is formed on the silicon layer 5, whereby the silicon layer 5 is properly covered with the interlayer dielectric film 21 of the $SiO_2$ single layer structure.

FIGS. 3A to 3K are schematic sectional views showing another process sequence for producing the semiconductor device shown in FIG. 1.

Figure 3A:
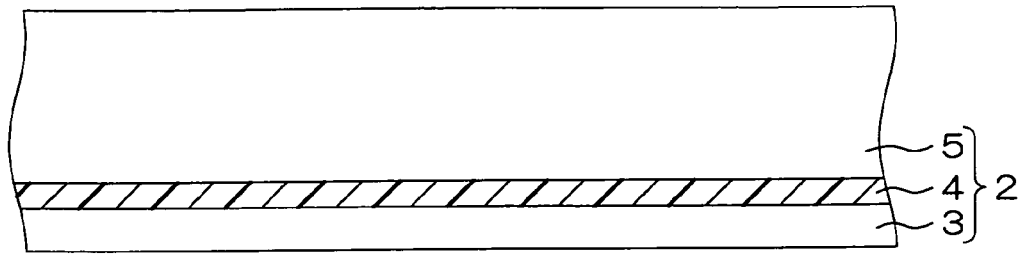
FIGS. 3A to 3K are schematic sectional views showing another process sequence for producing the semiconductor device shown in FIG. 1.

As shown in FIG. 3A, a silicon substrate 3 formed with a BOX layer 4 is prepared, and a silicon layer 5 is formed on the BOX layer 4 by an epitaxial growth method.

Figure 3B:
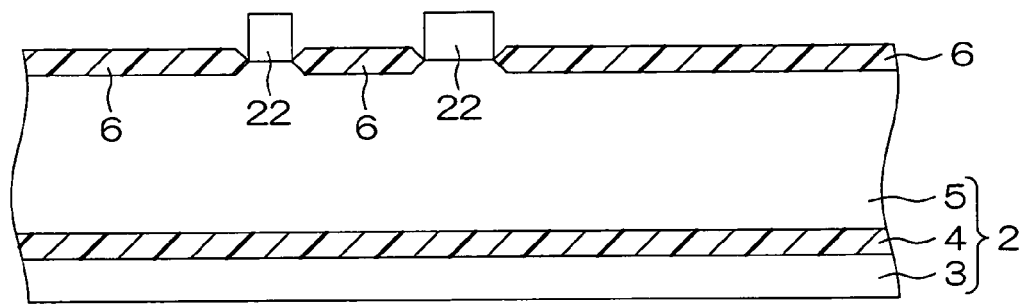

Next, as shown in FIG. 3B, a LOCOS oxide film 6 is formed on the silicon layer 5 by a LOCOS method. More specifically, a mask 22 is formed on the silicon layer as having an opening for selectively exposing a portion of the silicon layer 5 on which the LOCOS oxide film 6 is to be formed. Then, the LOCOS oxide film 6 is formed by thermally oxidizing the portion of the silicon layer 5 exposed from the opening of the mask 22. The mask 22 is removed after the formation of the LOCOS oxide film 6.

Figure 3C:
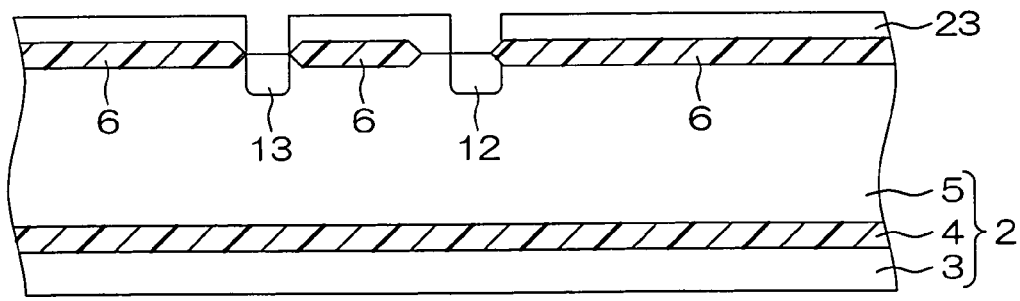

In turn, as shown in FIG. 3C, a mask 23 is formed on the silicon layer 5 as having openings for selectively exposing portions of the silicon layer 5 in which a source region 12 and a drain region 13 are to be formed. Then, a P-type impurity is implanted into surface portions of the silicon layer 5 via the mask 23 by an ion implantation method. The impurity implanted into the surface portions of the silicon layer 5 is activated by a heat treatment, whereby the source region 12 and the drain region 13 are formed. The mask 23 is removed after the formation of the source region 12 and the drain region 13.

Figure 3D:
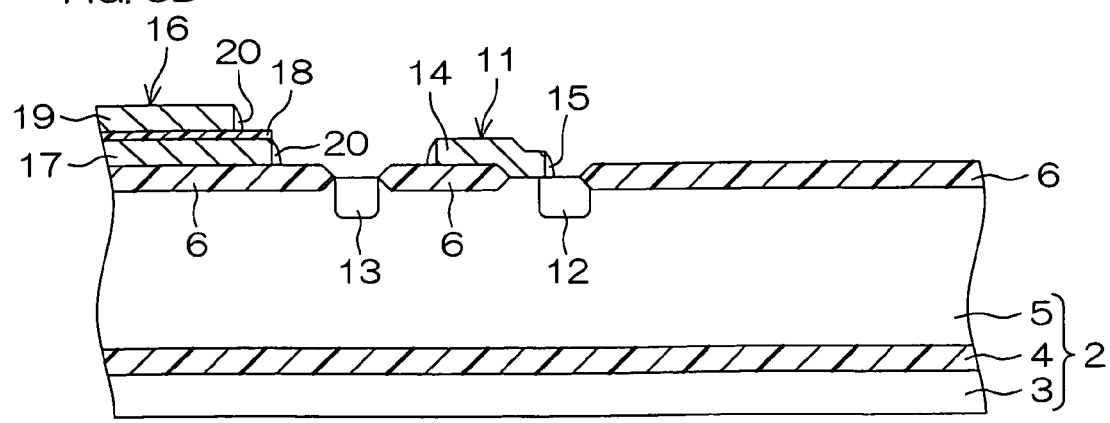

Thereafter, as shown in FIG. 3D, a P-channel MOSFET 11 and a floating capacitor 16 are formed on the silicon layer 5 and the LOCOS oxide film 6 in a region which later serves as an element formation region 10 (see FIG. 1).

Figure 3E:
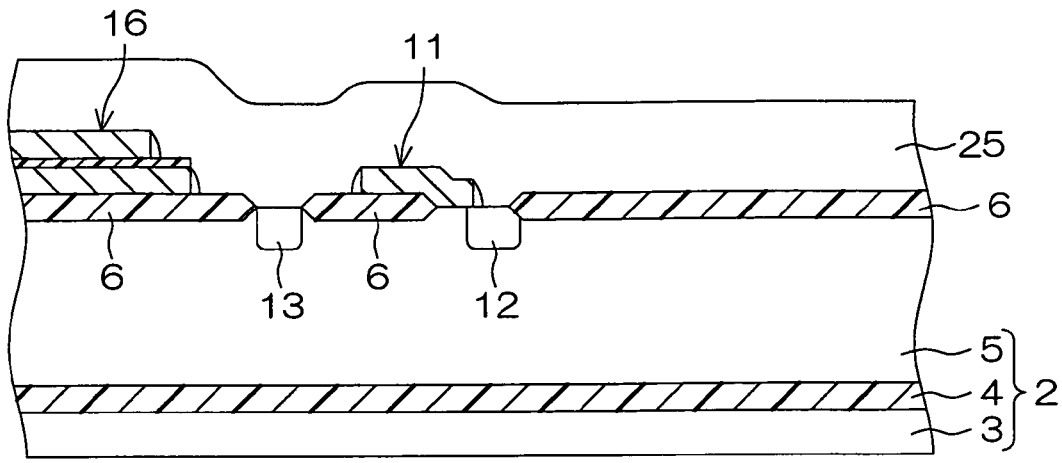

Subsequently, as shown in FIG. 3E, an $SiO_2$ layer 25 of $SiO_2$ is formed on the silicon layer 5 by a LPCVD method.

Figure 3F:
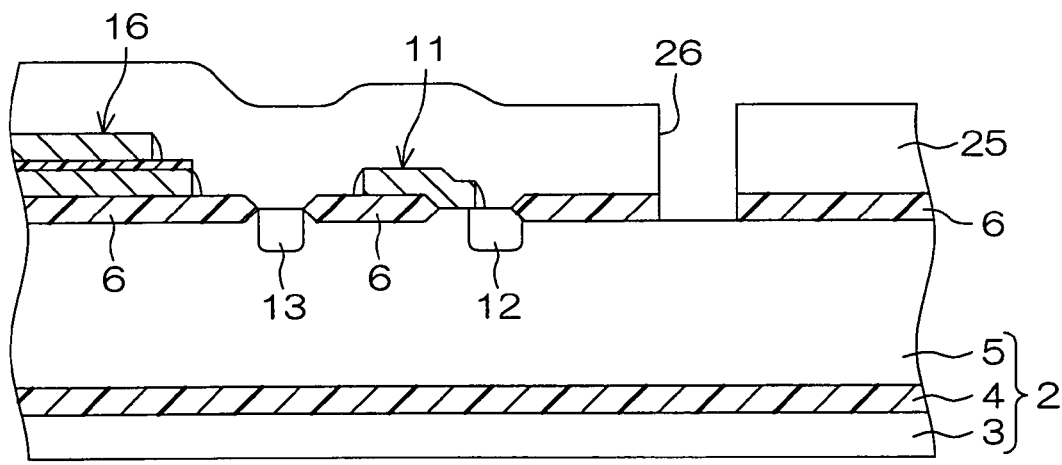

Then, as shown in FIG. 3F, the $SiO_2$ layer 25 and the LOCOS oxide film 6 are selectively removed by a photolithography and etching process, whereby an opening 26 is formed in the $SiO_2$ layer 25 and the LOCOS oxide film 6 as extending through the $SiO_2$ layer 25 and the LOCOS oxide film 6 to expose a part of a surface of the silicon layer 5.

Figure 3G:
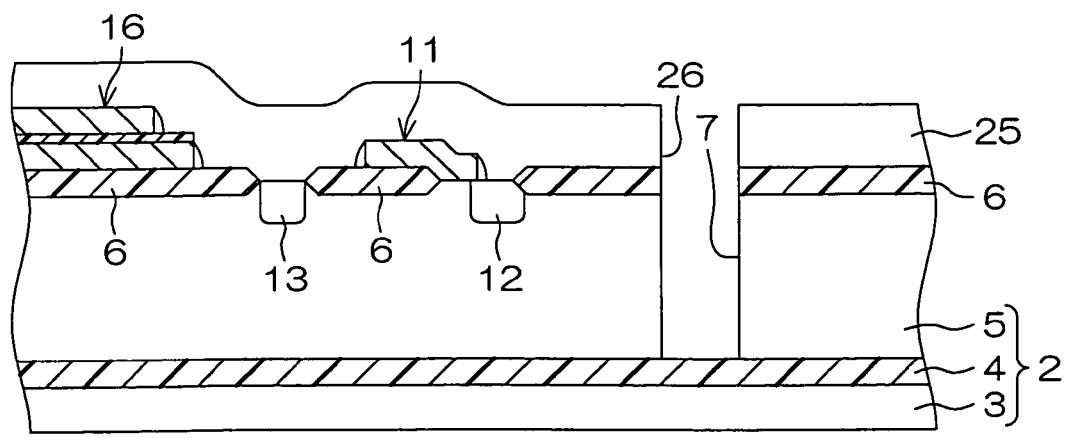

Thereafter, as shown in FIG. 3G, the silicon layer 5 is etched via the opening 26 formed in the $SiO_2$ layer 25 and the LOCOS oxide film 6. Thus, a trench 7 is formed in the silicon layer 5 as communicating with the opening 26. The etching of the silicon layer 5 is terminated when the BOX layer 4 is exposed.

Figure 3H:
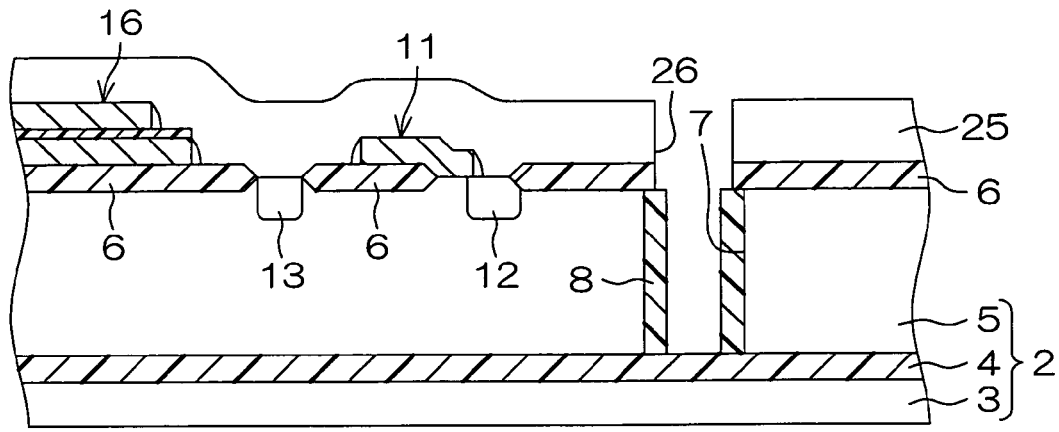

In turn, as shown in FIG. 3H, trench oxide films 8 are formed on side surfaces of the trench 7, for example, by a thermal oxidation method.

Figure 3I:
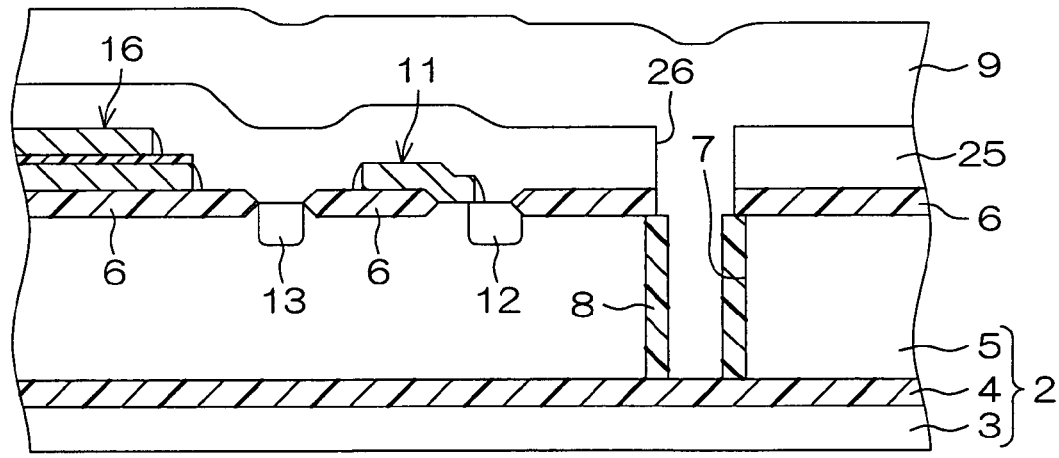

Thereafter, as shown in FIG. 3I, polysilicon 9 is deposited over the SiO$_2$ layer 25 including the trench 7 to a thickness such as to fill the trench 7 and cover the entire surface of the SiO$_2$ layer 25 by a CVD method.

Figure 3J:
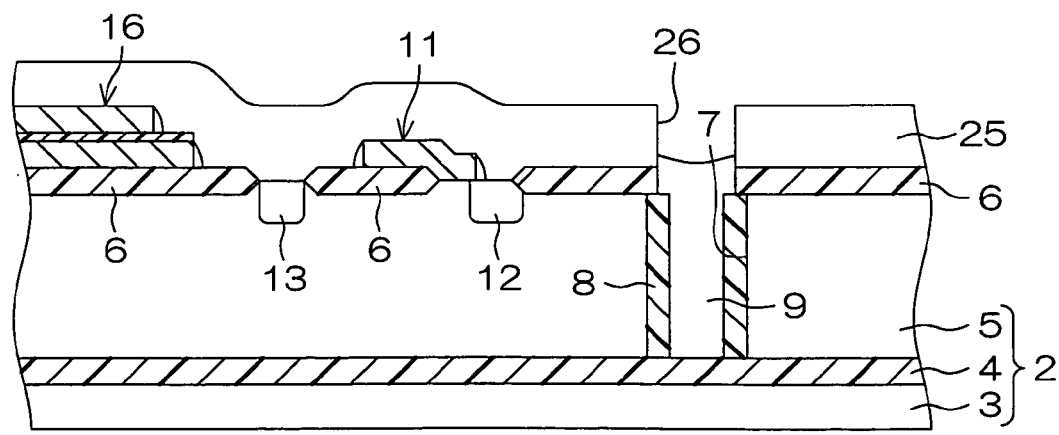

Then, the polysilicon 9 is etched back (by an entire surface dry-etching method). Through this etch-back, a part of the polysilicon 9 remains in the trench 7 as shown in FIG. 3J.

Figure 3K:
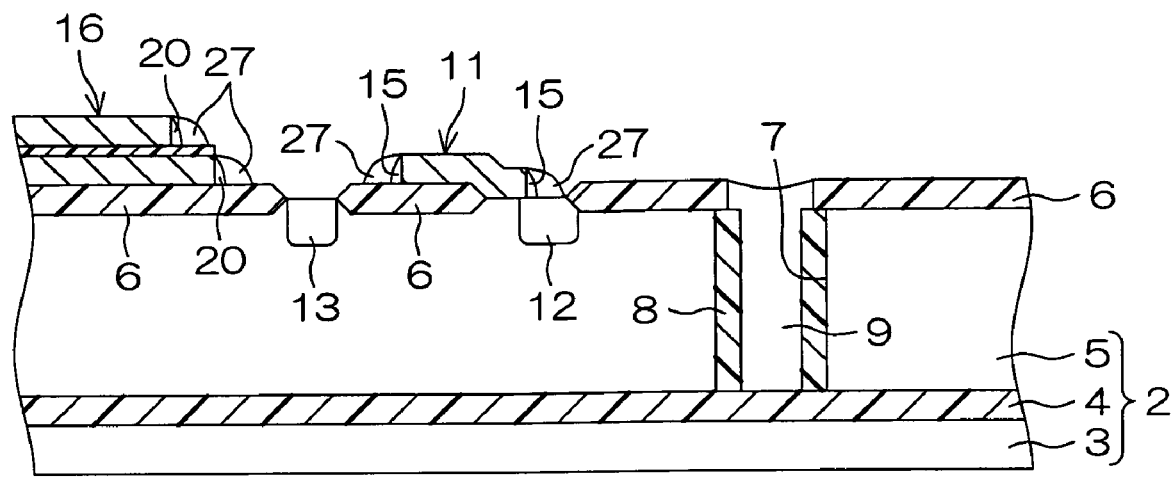

Thereafter, the SiO$_2$ layer 25 is etched back for removal thereof. Thus, as shown in FIG. 3K, the surface of the silicon layer 5 is exposed. At this time, a very small amount of a residue 27 of the SiO$_2$ layer 25 remains on lateral sides of sidewalls 15, 20.

Then, an interlayer dielectric film 21 is formed on the silicon layer 5 by a CVD method. Thus, the semiconductor device 1 shown in FIG. 1 is produced. The residue 27 remaining in steps of the silicon layer 5 and the interlayer dielectric film 21 are composed of the same SiO$_2$ material and, therefore, are substantially unified with each other when the interlayer dielectric film 21 is formed.

Since this method obviates the need for forming the SiN layer 24 shown in FIGS. 2E to 2L on the silicon layer 5 formed with the LOCOS oxide film 6, the P-channel MOSFET 11 and the floating capacitor 16, the number of process steps for producing the semiconductor device 1 is reduced.

Figure 4:
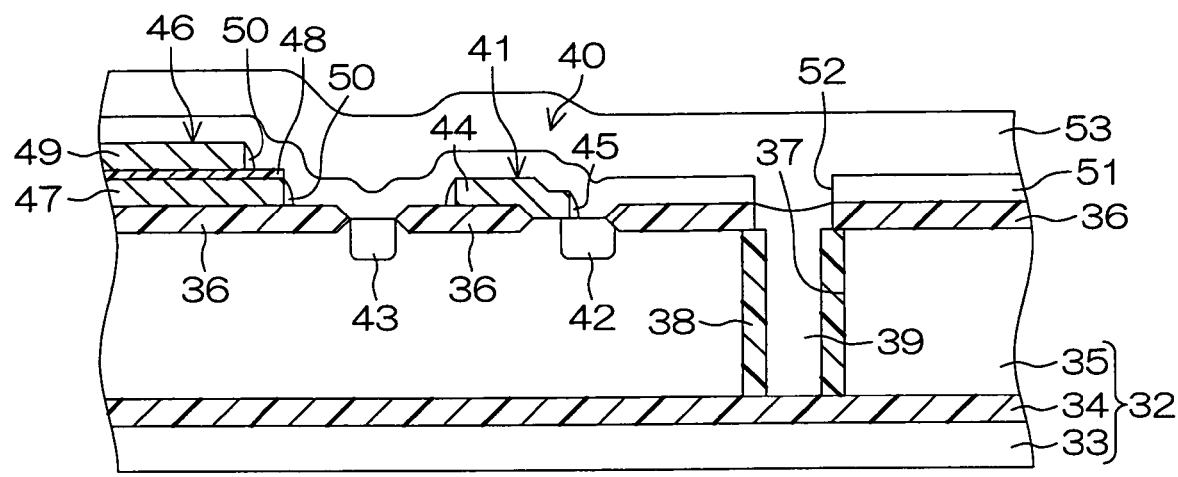
FIG. 4 is a schematic sectional view of a semiconductor device according to a second embodiment of the present invention.

FIG. 4 is a schematic sectional view of a semiconductor device according to a second embodiment of the present invention.

The semiconductor device 31 includes a thick SOI substrate 32. The thick SOI substrate 32 is configured such that an N-type silicon layer 35 of Si is provided on a silicon substrate 33 via a BOX layer 34 of SiO$_2$. A LOCOS oxide film 36 is selectively provided in a surface of the silicon layer 35.

An annular trench 37 is provided in the thick SOI substrate 32. The trench 37 is formed as extending through the silicon layer 35 by removing a part of the LOCOS oxide film 36 and then a part of the silicon layer 35. Trench oxide films 38 of SiO$_2$ are provided on side surfaces of the trench 37. The trench 37 is filled with polysilicon 39 with the intervention of the trench oxide films 38. Thus, a region surrounded by the trench 37 serves as an element formation region 40 which is isolated (dielectrically isolated) from its peripheral region by the trench oxide films 38.

A P-channel MOSFET 41, for example, is provided in the element formation region 40. More specifically, a P-type source region 42 and a P-type drain region 43 are provided in spaced relation in a surface portion of the silicon layer 35 in the element formation region 40. A part of the LOCOS oxide film 36 is present between the source region 42 and the drain region 43 in the surface of the silicon layer 35 in spaced relation from the source region 42. A gate electrode 44 of a metal material is provided between the part of the LOCOS oxide film 36 and the source region 42 on the surface of the silicon layer 35 via a gate oxide film (not shown). The gate electrode 44 partly overlies the part of the LOCOS oxide film 36 to serve as a field plate. Side surfaces of the gate electrode 44 are covered with a sidewall 45.

A floating capacitor 46 is provided in the element formation region 40. More specifically, a lower electrode 47 of a metal material is provided on another part of the LOCOS oxide film 36 present on a lateral side of the P-channel MOSFET 41 in the element formation region 40. An insulation film 48 and an upper electrode 49 of a metal material are provided in this order on the lower electrode 47. Side surfaces of the lower electrode 47 and the upper electrode 49 are covered with sidewalls 50.

Further, a SiN layer 51 of SiN is provided on the surface of the silicon layer 35. The SiN layer 51 has an opening extending therethrough and opposed to the polysilicon 39 provided in the trench 37. An interlayer dielectric film 53 of SiO$_2$ is provided on the SiN layer 51 and the polysilicon 39.

FIGS. 5A to 5K are schematic sectional views showing a process sequence for producing the semiconductor device shown in FIG. 4.

Figure 5A:
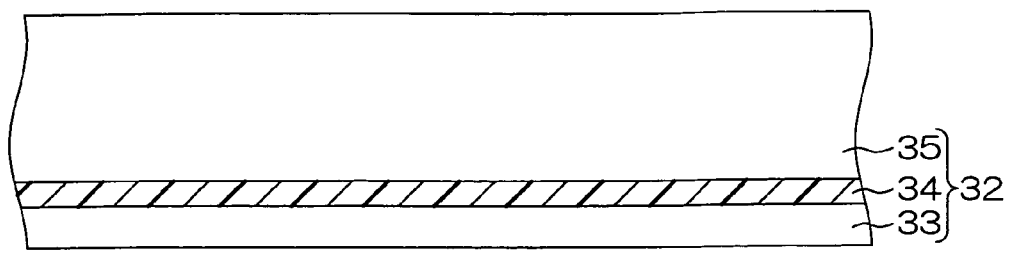
FIGS. 5A to 5K are schematic sectional views showing a process sequence for producing the semiconductor device shown in FIG. 4.

As shown in FIG. 5A, a silicon substrate 33 formed with a BOX layer 34 is prepared, and a silicon layer 35 is formed on the BOX layer 34 by an epitaxial growth method.

Figure 5B:
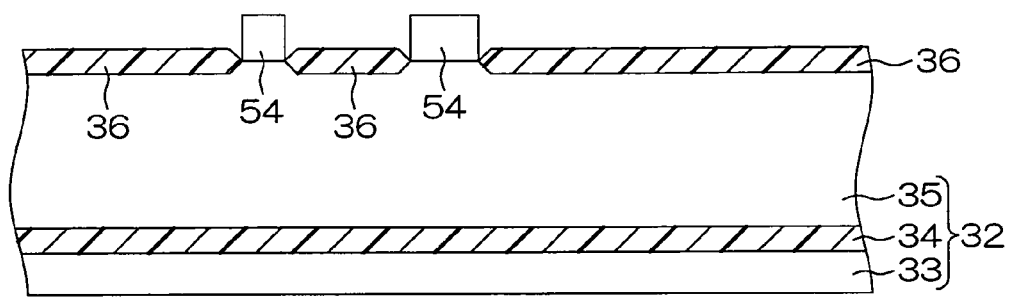

Next, as shown in FIG. 5B, a LOCOS oxide film 36 is formed on the silicon layer 35 by a LOCOS method. More specifically, a mask 54 is formed on the silicon layer 35 as having an opening for selectively exposing a portion of the silicon layer 35 on which the LOCOS oxide film 36 is to be formed. Then, the LOCOS oxide film 36 is formed by thermally oxidizing the portion of the silicon layer 35 exposed from the opening of the mask 54. The mask 54 is removed after the formation of the LOCOS oxide film 36.

Figure 5C:
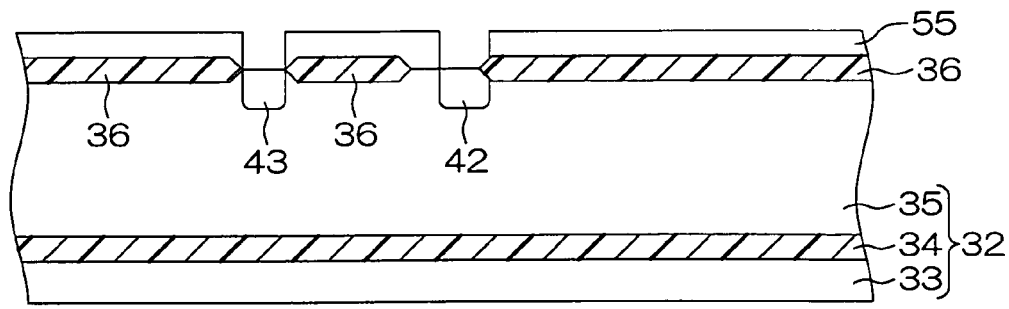

In turn, as shown in FIG. 5C, a mask 55 is formed on the silicon layer 35 as having openings for selectively exposing portions of the silicon layer 35 in which a source region 42 and a drain region 43 are to be formed. Then, a P-type impurity is implanted into surface portions of the silicon layer 35 via the mask 55 by an ion implantation method. The impurity implanted into the surface portions of the silicon layer 35 is activated by a heat treatment, whereby the source region 42 and the drain region 43 are formed. The mask 55 is removed after the formation of the source region 42 and the drain region 43.

Figure 5D:
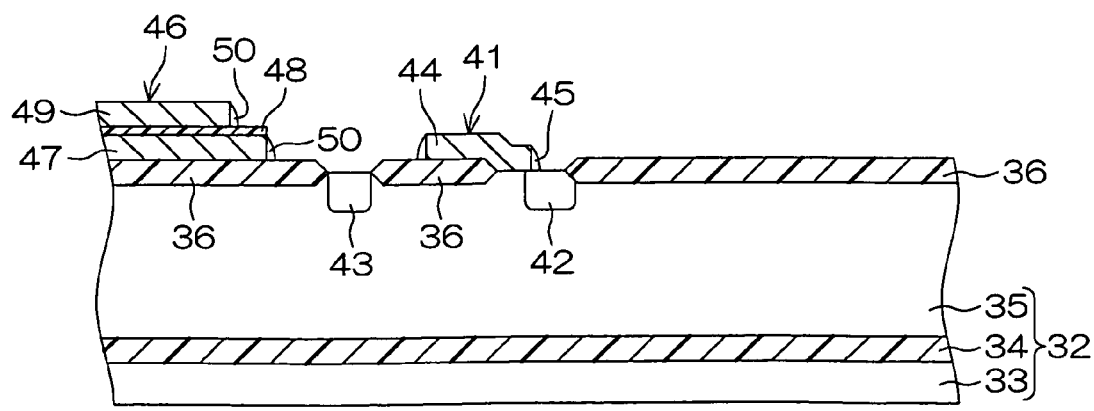

Thereafter, as shown in FIG. 5D, a gate electrode 44 of a P-channel MOSFET 41 and a floating capacitor 46 are formed on the silicon layer 35 and the LOCOS oxide film 36 in a region which later serves as an element formation region 40 (see FIG. 4).

Figure 5E:
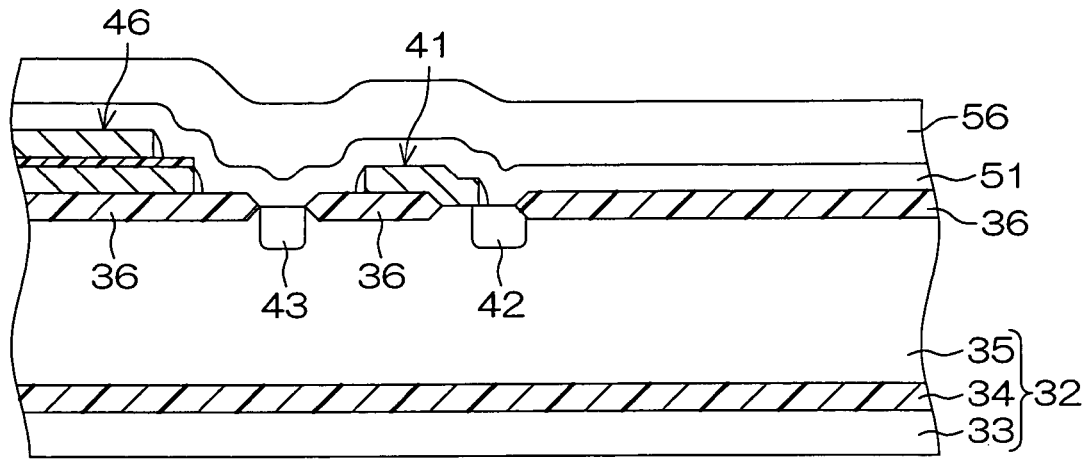

Subsequently, as shown in FIG. 5E, an SiN layer 51 of SiN and an SiO$_2$ layer 56 of SiO$_2$ are formed on the silicon layer 35 in this order from the side of the silicon layer 35 by a LPCVD method.

Figure 5F:
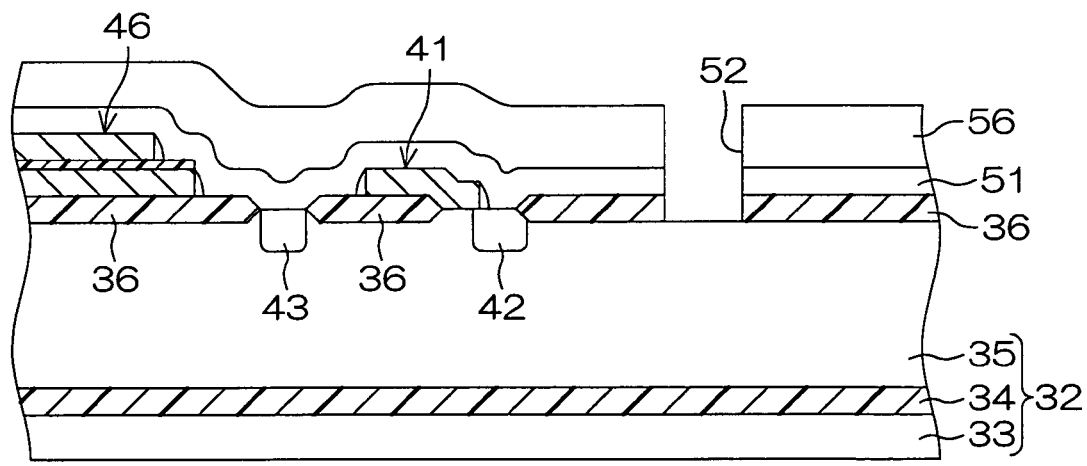

Then, as shown in FIG. 5F, the SiO$_2$ layer 56, the SiN layer 51 and the LOCOS oxide film 36 are selectively removed by a photolithography and etching process, whereby an opening 52 is formed in the SiO$_2$ layer 56, the SiN layer 51 and the LOCOS oxide film 36 as extending through the SiO$_2$ layer 56, the SiN layer 51 and the LOCOS oxide film 36 to expose a part of a surface of the silicon layer 35.

Figure 5G:
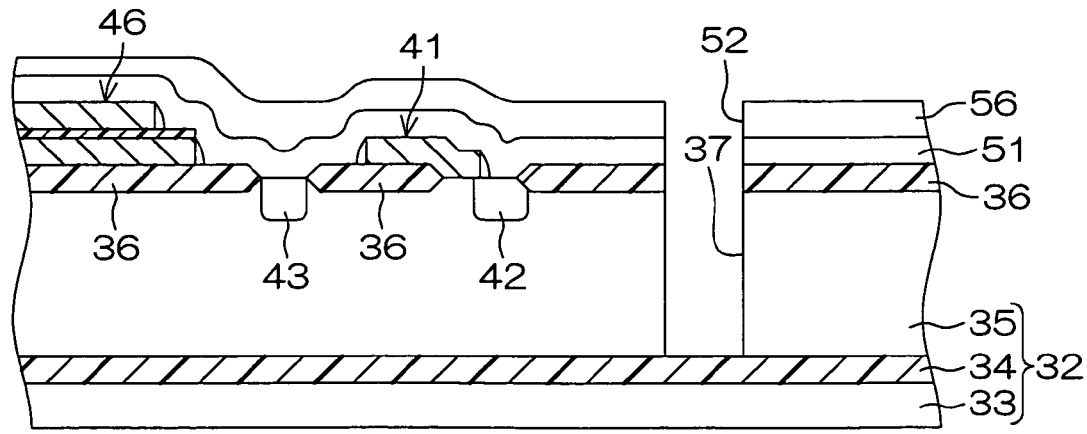

Thereafter, as shown in FIG. 5G, the silicon layer 35 is etched via the opening 52 formed in the SiO$_2$ layer 56, the SiN layer 51 and the LOCOS oxide film 36. Thus, a trench 37 is formed in the silicon layer 35 as communicating with the opening 52. The etching of the silicon layer 35 is terminated when the BOX layer 34 is exposed.

Figure 5H:
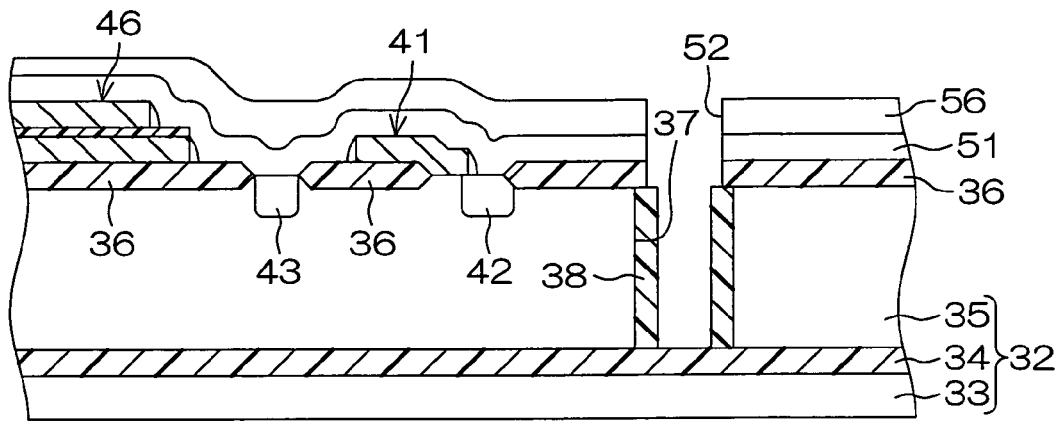

In turn, as shown in FIG. 5H, trench oxide films 38 are formed on side surfaces of the trench 37, for example, by a thermal oxidation method. Similarly to the formation of the trench oxide films 8, the formation of the trench oxide films 38 may be achieved by employing a TEOS-CVD method or by employing the thermal oxidation method and the TEOS-CVD method in combination rather than by employing the thermal oxidation method alone.

Figure 5I:
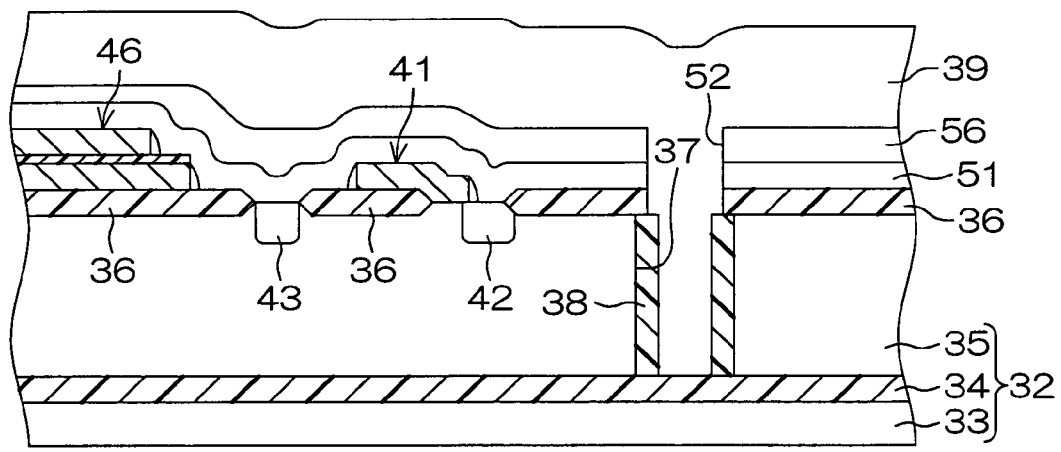

Thereafter, as shown in FIG. 5I, polysilicon 39 is deposited over the SiO$_2$ layer 56 including the trench 37 to a thickness such as to fill the trench 37 and cover the entire surface of the SiO₂ layer 56 by a CVD method.

Figure 5J:
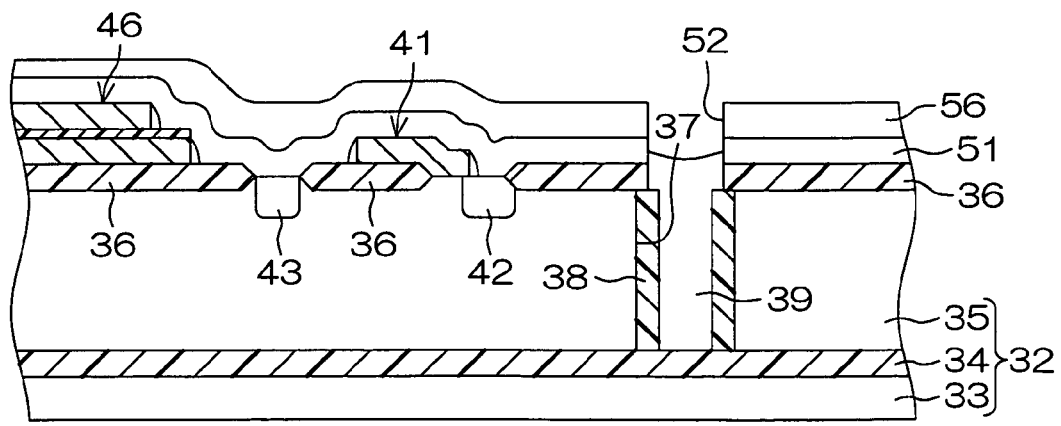

Then, the polysilicon 39 is etched back (by an entire surface dry-etching method). Through this etch-back, a part of the polysilicon 39 remains in the trench 37 as shown in FIG. 5J.

Figure 5K:
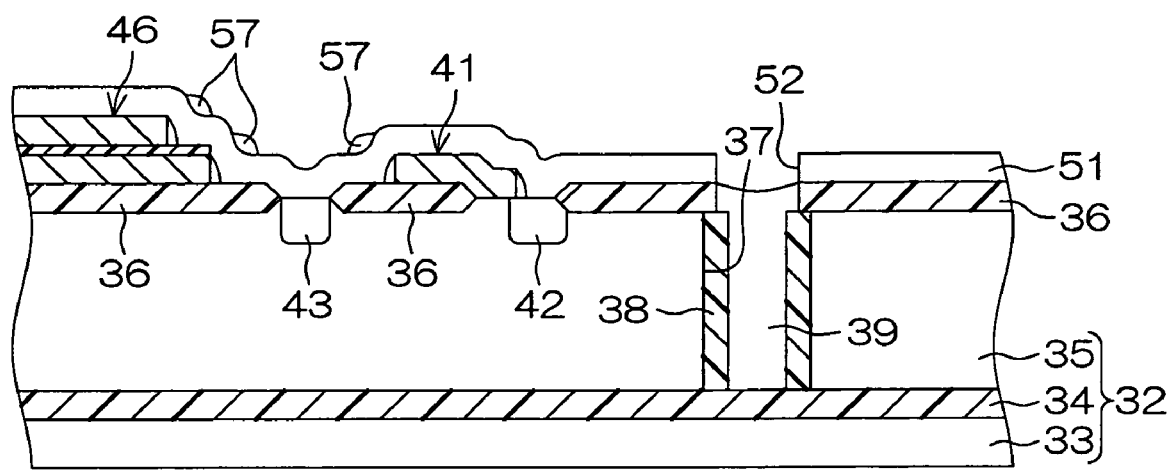

Thereafter, the SiO₂ layer 56 is etched back for removal thereof. Thus, as shown in FIG. 5K, a surface of the SiN layer 51 is exposed. At this time, a very small amount of a residue 57 of the SiO₂ layer 56 remains in steps of the SiN layer 51.

Then, an interlayer dielectric film 53 is formed on the SiN layer 51 by a CVD method. Thus, the semiconductor device 31 shown in FIG. 4 is produced. The residue 57 remaining in the steps of the SiN layer 51 and the interlayer dielectric film 53 are composed of the same SiO₂ material and, therefore, are substantially unified with each other when the interlayer dielectric film 53 is formed.

In this method, the interlayer dielectric film 53 of SiO₂ is formed on the SiN layer 51 without removing the SiN layer 51 after the removal of the SiO₂ layer 56. Even if part (the residue 57) of the SiO₂ layer 56 remains on the SiN layer 51, the residue 57 is unified with the interlayer dielectric film 53 thereafter formed. Even if the SiN layer 51 is present between the silicon layer 35 and the interlayer dielectric film 53, there is no problem associated with insulation between the silicon layer 35 and interconnections provided on the interlayer dielectric film 53 because the SiN layer 51 is also electrically insulative. On the other hand, the step of removing the SiN layer 51 is obviated, so that the production method for the semiconductor device 31 is simplified as compared with the production method shown in FIGS. 2A to 2L.

Figure 6:
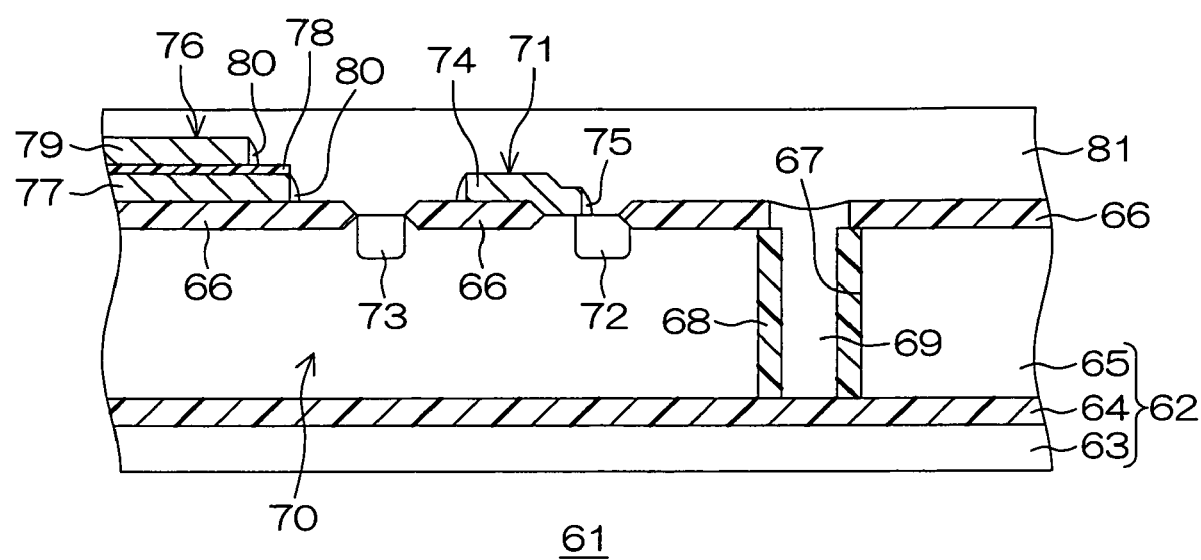
FIG. 6 is a schematic sectional view of a semiconductor device according to a third embodiment of the present invention.

FIG. 6 is a schematic sectional view of a semiconductor device according to a third embodiment of the present invention.

The semiconductor device 61 includes a thick SOI substrate 62. The thick SOI substrate 62 is configured such that an N-type silicon layer 65 of Si is provided on a silicon substrate 63 via a BOX layer 64 of SiO₂. A LOCOS oxide film 66 is selectively provided on the silicon layer 65.

An annular trench 67 is provided in the thick SOI substrate 62. The trench 67 is formed as extending through the silicon layer 65 by removing a part of the LOCOS oxide film 66 and then a part of the silicon layer 65. Trench oxide films 68 of SiO₂ are provided on side surfaces of the trench 67. The trench 67 is filled with polysilicon 69 with the intervention of the trench oxide films 68. Thus, a region surrounded by the trench 67 serves as an element formation region 70 which is isolated (dielectrically isolated) from its peripheral region by the trench oxide films 68.

A P-channel MOSFET 71, for example, is provided in the element formation region 70. More specifically, a P-type source region 72 and a P-type drain region 73 are provided in spaced relation in a surface portion of the silicon layer 65 in the element formation region 70. A part of the LOCOS oxide film 66 is present between the source region 72 and the drain region 73 in a surface of the silicon layer 65 in spaced relation from the source region 72. A gate electrode 74 of a metal material is provided between the part of the LOCOS oxide film 66 and the source region 72 on the surface of the silicon layer 65 via a gate oxide film (not shown). The gate electrode 74 partly overlies the part of the LOCOS oxide film 66 to serve as a field plate. Side surfaces of the gate electrode 74 are covered with a sidewall 75.

A floating capacitor 76 is provided in the element formation region 70. More specifically, a lower electrode 77 of a metal material is provided on another part of the LOCOS oxide film 66 present on a lateral side of the P-channel MOSFET 71 in the element formation region 70. An insulation film 78 and an upper electrode 79 of a metal material are provided in this order on the lower electrode 77. Side surfaces of the lower electrode 77 and the upper electrode 79 are covered with sidewalls 80.

An interlayer dielectric film 81 of SiO₂ is provided on the surface of the silicon layer 65. The interlayer dielectric film 81 has a flat surface.

FIGS. 7A to 7K are schematic sectional views showing a process sequence for producing the semiconductor device shown in FIG. 6.

Figure 7A:
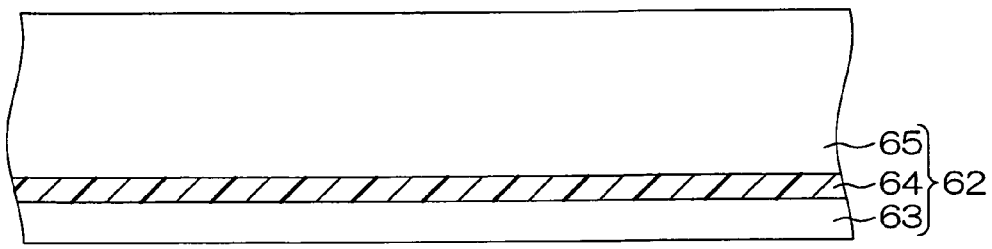
FIGS. 7A to 7K are schematic sectional views showing a process sequence for producing the semiconductor device shown in FIG. 6.

As shown in FIG. 7A, a silicon substrate 63 formed with a BOX layer 64 is prepared, and a silicon layer 65 is formed on the BOX layer 64 by an epitaxial growth method.

Figure 7B:
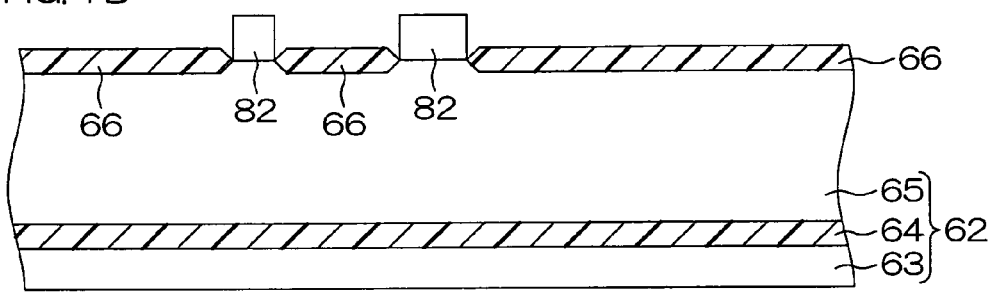

Next, as shown in FIG. 7B, a LOCOS oxide film 66 is formed on the silicon layer 65 by a LOCOS method. More specifically, a mask 82 is formed on the silicon layer 65 as having an opening for selectively exposing a portion of the silicon layer 65 on which the LOCOS oxide film 66 is to be formed. Then, the LOCOS oxide film 66 is formed by thermally oxidizing the portion of the silicon layer 65 exposed from the opening of the mask 82. The mask 82 is removed after the formation of the LOCOS oxide film 66.

Figure 7C:
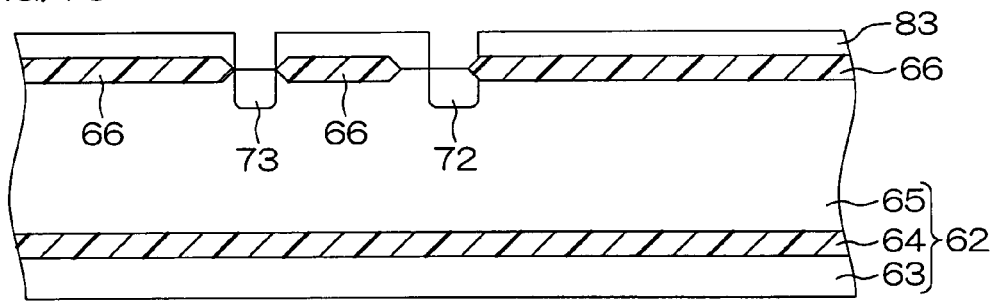

In turn, as shown in FIG. 7C, a mask 83 is formed on the silicon layer 65 as having openings for selectively exposing portions of the silicon layer 65 in which a source region 72 and a drain region 73 are to be formed. Then, an N- or P-type impurity is implanted into surface portions of the silicon layer 65 via the mask 83 by an ion implantation method. The impurity implanted into the surface portions of the silicon layer 65 is activated by a heat treatment, whereby the source region 72 and the drain region 73 are formed. The mask 83 is removed after the formation of the source region 72 and the drain region 73.

Figure 7D:
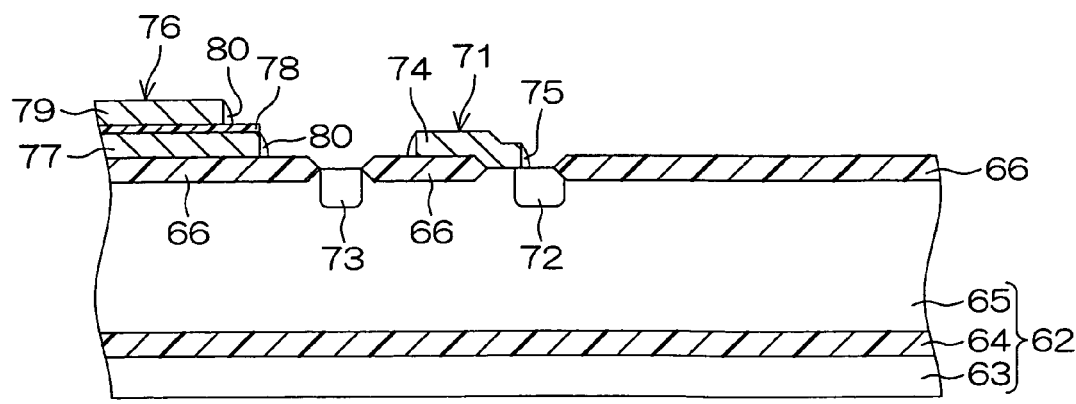

Thereafter, as shown in FIG. 7D, a gate electrode 74 of a P-channel MOSFET 71 and a floating capacitor 76 are formed on the silicon layer 65 and the LOCOS oxide film 66 in a region which later serves as an element formation region 70 (see FIG. 6).

Figure 7E:
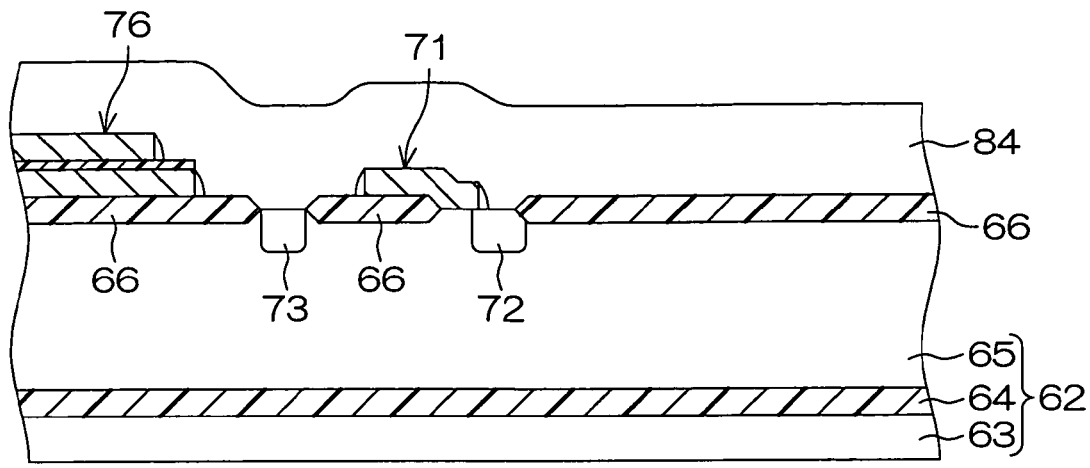

Subsequently, as shown in FIG. 7E, an SiO₂ layer 84 of SiO₂ is formed on the silicon layer 65 by an LPCVD method.

Figure 7F:
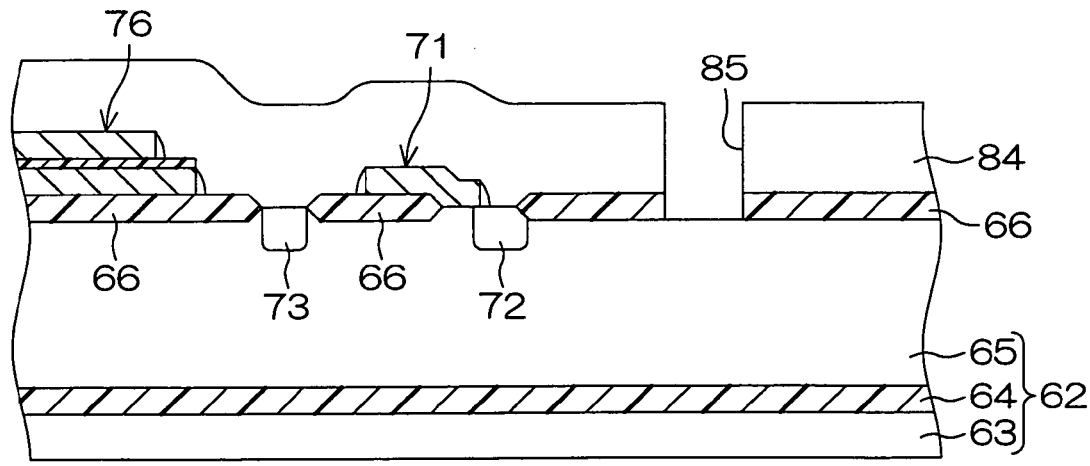

Then, as shown in FIG. 7F, the SiO₂ layer 84 and the LOCOS oxide film 66 are selectively removed by a photolithography and etching process, whereby an opening 85 is formed in the SiO₂ layer 84 and the LOCOS oxide film 66 as extending through the SiO₂ layer 84 and the LOCOS oxide film 66 to expose a part of a surface of the silicon layer 65.

Figure 7G:
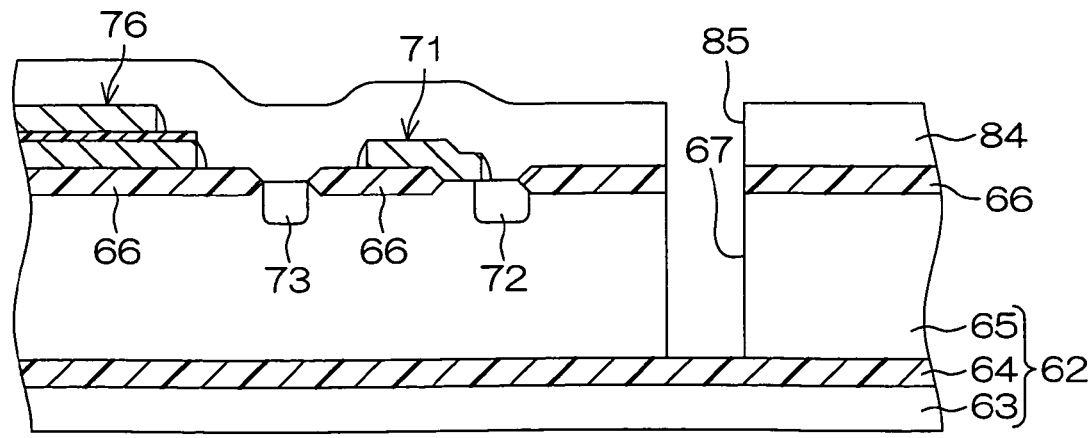

Thereafter, as shown in FIG. 7G, the silicon layer 65 is etched via the opening 85 formed in the SiO₂ layer 84 and the LOCOS oxide film 66. Thus, a trench 67 is formed in the silicon layer 65 as communicating with the opening 85. The etching of the silicon layer 65 is terminated when the BOX layer 64 is exposed.

Figure 7H:
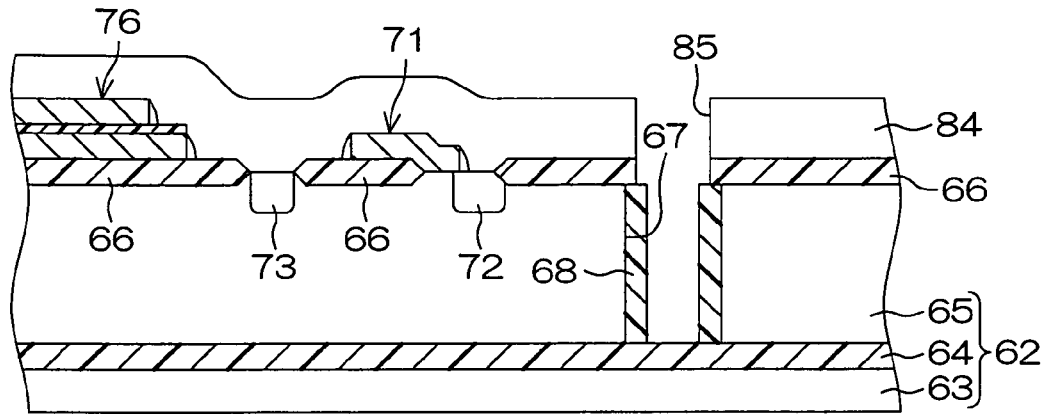
Figure 7:
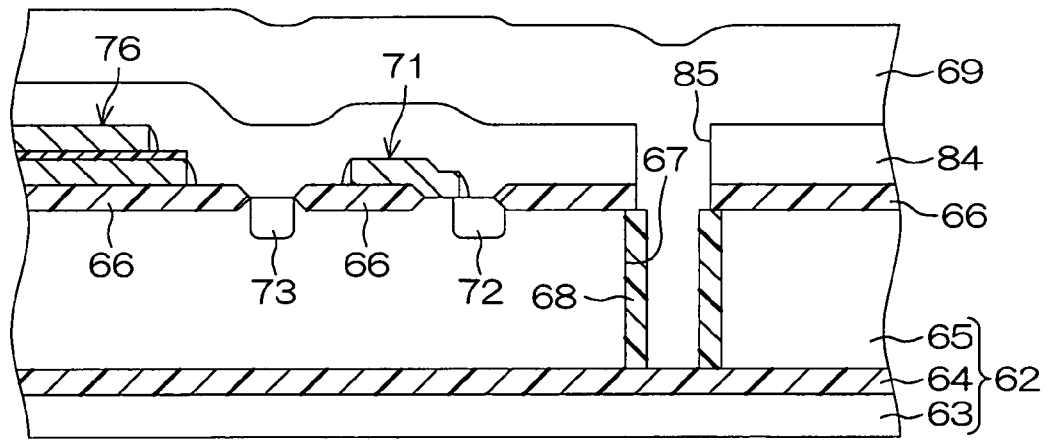
Figure 7:
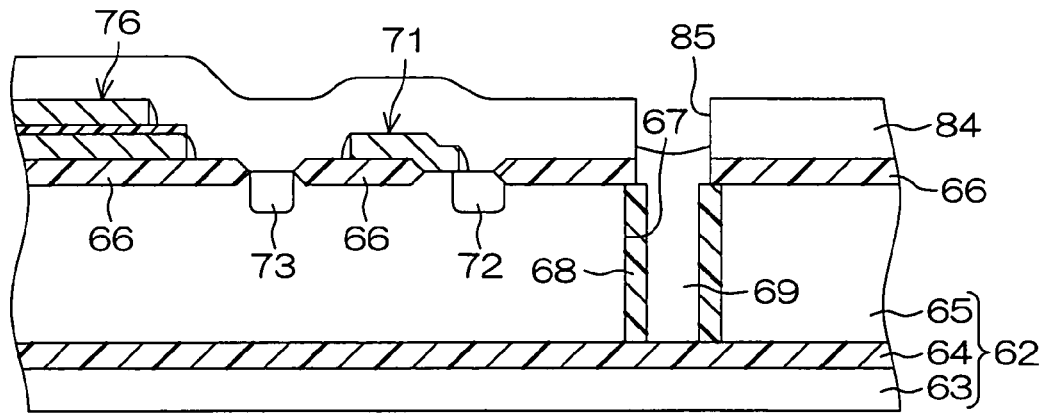

In turn, as shown in FIG. 7H, trench oxide films 68 are formed on side surfaces of the trench 67, for example, by a thermal oxidation method. Similarly to the formation of the trench oxide films 8, the formation of the trench oxide films 68 may be achieved by employing a TEOS-CVD method or by employing the thermal oxidation method and the TEOS-CVD method in combination rather than by employing the thermal oxidation method alone.

Thereafter, as shown in FIG. 7I, polysilicon 69 is deposited over the SiO₂ layer 84 including the trench 67 to a thickness such as to fill the trench 67 and cover the entire surface of the SiO₂ layer 84 by a CVD method.

Then, the polysilicon 69 is etched back (by an entire surface dry-etching method). Through this etch-back, a part of the polysilicon 69 remains in the trench 67 as shown in FIG. 7J.

Figure 7K:
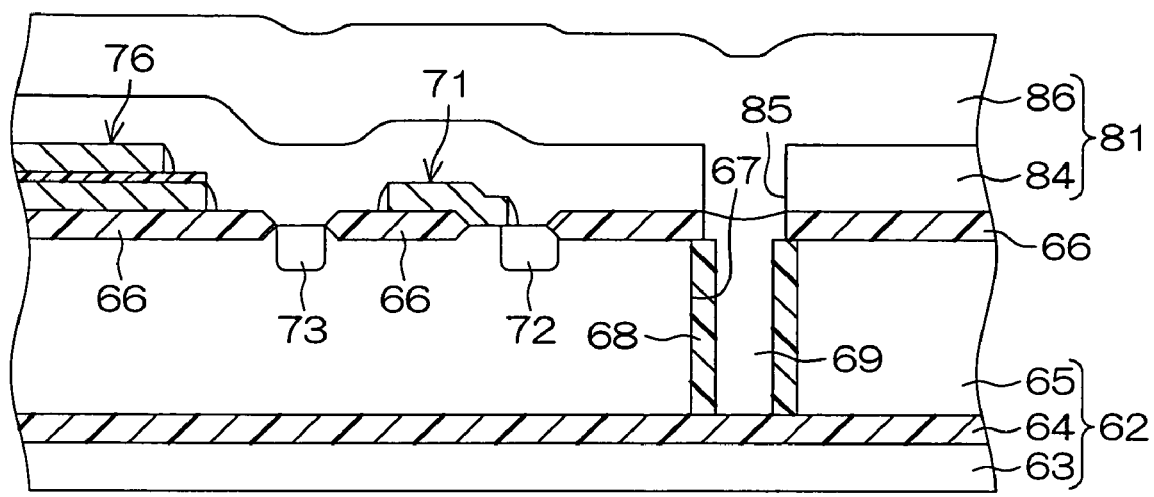

Thereafter, as shown in FIG. 7K, a second $SiO_2$ layer 86 of $SiO_2$ is formed over the $SiO_2$ layer 84 and on the polysilicon 69 in the opening 85 by a LPCVD method. Thus, the opening 85 is filled with the second $SiO_2$ layer 86. After the formation of the second $SiO_2$ layer 86, the $SiO_2$ layer 84 and the second $SiO_2$ layer 86 which are both composed of $SiO_2$ are substantially unified to serve as an interlayer dielectric film 81.

Thereafter, a surface of the interlayer dielectric film 81 is planarized by a CMP (chemical mechanical polishing) method. Thus, the semiconductor device 61 shown in FIG. 6 is produced.

The semiconductor device 61 produced by this method also provides the same effects as the semiconductor device 1 shown in FIG. 1.

Figure 8A:
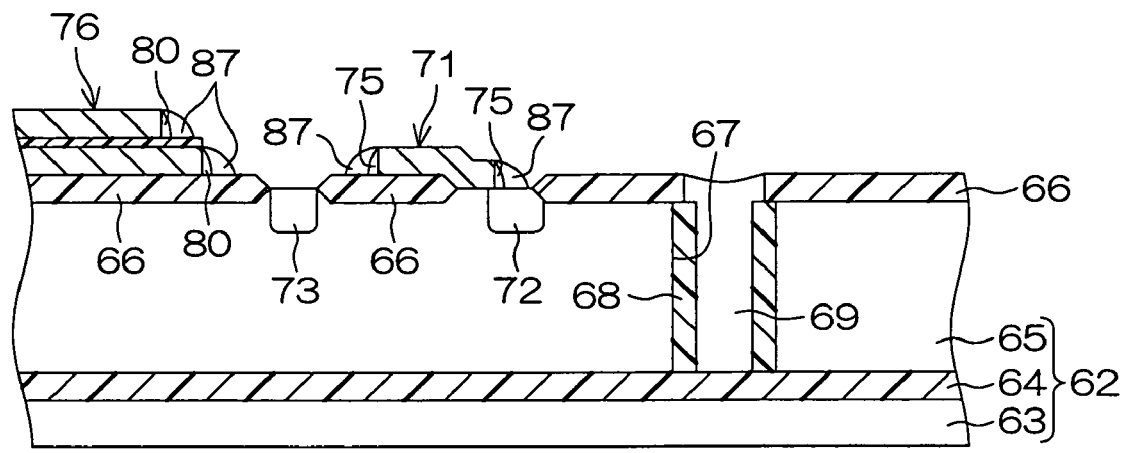
FIGS. 8A and 8B are schematic sectional views showing process steps to be performed instead of a step shown in FIG. 7K.
Figure 8B:
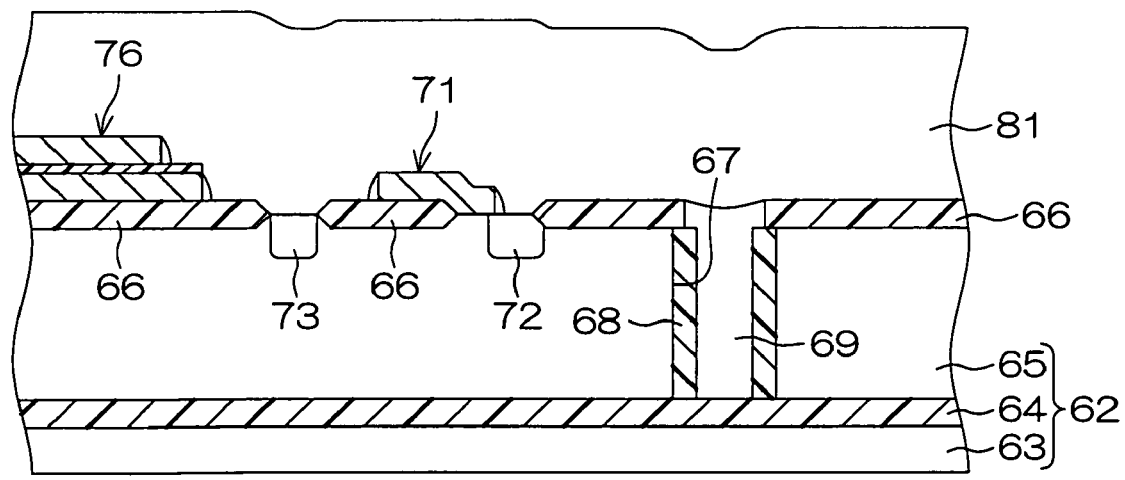
Figure 9:
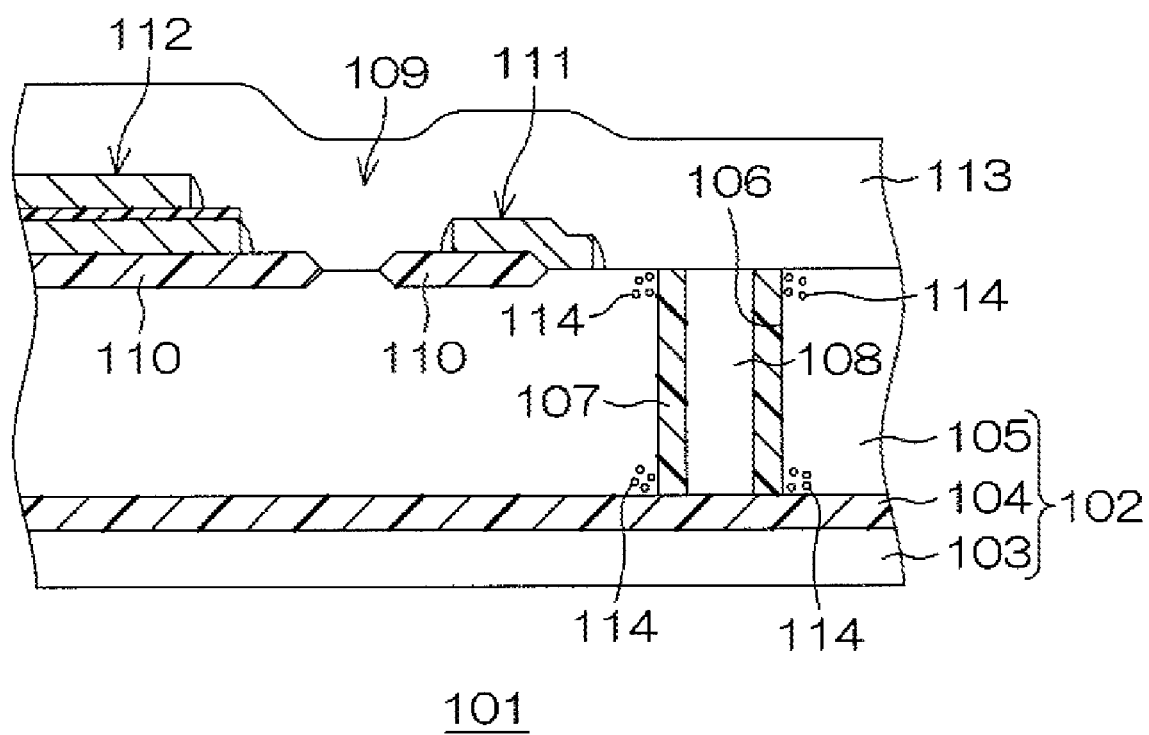
FIG. 9 is a schematic sectional view of a prior art semiconductor device.

After the step shown in FIG. 7J, steps shown in FIGS. 8A and 8B may be performed instead of the step shown in FIG. 7K.

More specifically, as shown in FIG. 8A, the $SiO_2$ layer 84 is etched back on the silicon layer 65 for removal thereof after the step shown in FIG. 7J. At this time, a very small amount of a residue 87 of the $SiO_2$ layer 84 remains on lateral sides of the sidewalls 75, 80.

Thereafter, an interlayer dielectric film 81 of $SiO_2$ is formed over the silicon layer 65 formed with the LOCOS oxide film 66, the polysilicon 69, the P-channel MOSFET 71 and the floating capacitor 76 by a CVD method. At this time, the residue 87 remaining in steps on the silicon layer 65 and the interlayer dielectric film 81 are composed of the same $SiO_2$ material and, therefore, are substantially unified with each other when the interlayer dielectric film 81 is formed.

Then, a surface of the interlayer dielectric film 81 is planarized by a CMP (chemical mechanical polishing) method. The semiconductor device 61 shown in FIG. 6 can also be produced by this method.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-272142 filed in the Japan Patent Office on Oct. 22, 2008, the disclosure of which is incorporated herein by reference.

What is claimed is:

1. A semiconductor device production method comprising:
    forming a LOCOS oxide film in a surface portion of a silicon layer by a LOCOS method;
    forming an impurity region in the silicon layer by introducing an impurity into the silicon layer;
    sequentially removing parts of the LOCOS oxide film and the silicon layer to form a trench for isolation of the impurity region after the formation of the LOCOS oxide film and the impurity region;
    forming an SiN layer of SiN and an $SiO_2$ layer of $SiO_2$ in this order on the silicon layer prior to the formation of the trench after the formation of the LOCOS oxide film and the impurity region; and
    forming an opening in the SiN layer and the $SiO_2$ layer for selectively exposing a surface of the LOCOS oxide film by a photolithography and etching process;
    wherein the trench is formed by etching the LOCOS oxide film and the silicon layer by using the SiN layer and the $SiO_2$ layer as a mask after the formation of the opening.

2. The semiconductor device production method according to claim 1, further comprising:
    depositing polysilicon in the trench by using the mask to fill the trench with the polysilicon; and
    etching back the $SiO_2$ layer to remove the $SiO_2$ layer after the trench is filled with the polysilicon.

3. The semiconductor device production method according to claim 2, further comprising:
    removing the SiN layer after the removal of the $SiO_2$ layer; and
    forming an interlayer dielectric film of $SiO_2$ on the silicon layer after the removal of the SiN layer.

4. The semiconductor device production method according to claim 1, further comprising:
    preparing a silicon substrate formed with a BOX layer; and
    forming the silicon layer on the BOX layer by an epitaxial growth method before the step of forming the LOCOS oxide film;
    wherein the trench extends through the silicon layer and reaches the BOX layer.

5. The semiconductor device production method according to claim 1, wherein forming the impurity region comprises forming a drain region and a source region.

6. The semiconductor device production method according to claim 5, further comprising forming a gate electrode of a metal material provided between the drain region and the source region.

* * * * *